(12) United States Patent
Song

(10) Patent No.: US 11,832,449 B2
(45) Date of Patent: Nov. 28, 2023

(54) SEMICONDUCTOR DEVICE

(71) Applicant: Samsung Electronics Co., Ltd., Suwon-si (KR)

(72) Inventor: Woo Bin Song, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 313 days.

(21) Appl. No.: 17/147,897

(22) Filed: Jan. 13, 2021

(65) Prior Publication Data

US 2021/0358924 A1 Nov. 18, 2021

(30) Foreign Application Priority Data

May 14, 2020 (KR) .................... 10-2020-0057482

(51) Int. Cl.
| | |
|---|---|
| *H01L 29/78* | (2006.01) |
| *H10B 51/30* | (2023.01) |
| *H01L 29/06* | (2006.01) |
| *H01L 29/786* | (2006.01) |
| *H01L 29/423* | (2006.01) |

(52) U.S. Cl.
CPC ......... *H10B 51/30* (2023.02); *H01L 29/0673* (2013.01); *H01L 29/42392* (2013.01); *H01L 29/78391* (2014.09); *H01L 29/78696* (2013.01); *H01L 2029/42388* (2013.01)

(58) Field of Classification Search
CPC .......... H01L 29/78391; H01L 29/0673; H01L 29/42392
See application file for complete search history.

(56) References Cited

U.S. PATENT DOCUMENTS

| | | | |
|---|---|---|---|
| 8,125,038 | B2 | 2/2012 | Ahn et al. |
| 10,056,393 | B2 | 8/2018 | Schröder et al. |
| 10,475,813 | B2 | 11/2019 | Yoo |
| 2018/0240804 | A1* | 8/2018 | Yoo .................. H01L 21/28088 |
| 2019/0318774 | A1 | 10/2019 | Kittl et al. |
| 2020/0013784 | A1* | 1/2020 | An ......................... H10B 51/30 |
| 2020/0013897 | A1 | 1/2020 | Park et al. |

FOREIGN PATENT DOCUMENTS

| | | |
|---|---|---|
| JP | 2005064522 A | 3/2005 |
| JP | 2014053568 A | 3/2014 |
| KR | 1020190119203 A | 10/2019 |

\* cited by examiner

*Primary Examiner* — Errol V Fernandes
(74) *Attorney, Agent, or Firm* — Myers Bigel, P.A.

(57) ABSTRACT

A semiconductor device includes a substrate including a first region and a second region, a first gate stack on the first region and including a first gate stacked insulating film and a first gate electrode on the first gate stacked insulating film, and a second gate stack on the second region and including a second gate stacked insulating film and a second gate electrode on the second gate stacked insulating film, wherein a width of the first gate stack is greater than a width of the second gate stack and the second gate stacked insulating film includes a plurality of ferroelectric material films.

20 Claims, 21 Drawing Sheets

SEMICONDUCTOR DEVICE

CROSS-REFERENCE TO RELATED APPLICATION

This application claims priority from Korean Patent Application No. 10-2020-0057482, filed on May 14, 2020, in the Korean Intellectual Property Office, the disclosure of which is incorporated herein by reference in its entirety.

BACKGROUND

1. Field of the Disclosure

The present disclosure relates to semiconductor devices and, more particularly, to semiconductor devices including a ferroelectric film.

2. Related Art

After development of MOSFET transistors, a degree of integration of integrated circuit has increased over time. For example, the degree of integration of integrated circuits has a trend in which the number of total transistors per unit chip area doubles approximately every two years. To increase the degree of integration of such integrated circuits, the size of individual transistors has decreased. In addition, semiconductor design techniques for improving the performance of miniaturized transistors have emerged.

The semiconductor design techniques may include a high-K metal gate (HKMG) technique that improves a gate capacitance and reduces a leakage current, a FinFET technique that can improve a SCE (short channel effect) in which the potential of a channel region is affected by a drain voltage, and the like.

However, a reduction of a drive voltage of a transistor has not been significantly improved as compared with a decrease in the transistor size. As a result, a power density of CMOS transistors may exponentially increase. To reduce the power density, a power reduction of the drive voltage may be sought. However, because silicon-based MOSFETs have a physical operating property on the basis of thermal emission, it may be difficult to achieve a very low supply voltage.

SUMMARY

Aspects of the present disclosure provide a semiconductor device that may improve the characteristics of an element through use of a gate insulating film including a ferroelectric material film having negative capacitance (NC) characteristics.

According to an aspect of the present disclosure, there is provided a semiconductor device comprising, a substrate including a first region and a second region, a first gate stack on the first region and including a first gate stacked insulating film and a first gate electrode on the first gate stacked insulating film, and a second gate stack on the second region and including a second gate stacked insulating film and a second gate electrode on the second gate stacked insulating film, wherein a width of the first gate stack is greater than a width of the second gate stack and the second gate stacked insulating film includes a plurality of ferroelectric material films.

According to another aspect of the present disclosure, there is provided a semiconductor device comprising, a substrate including a first region and a second region, a first gate stack on the first region and including a first gate stacked insulating film and a first gate electrode on the first gate stacked insulating film, and a second gate stack on the second region and including a second gate stacked insulating film and a second gate electrode on the second gate stacked insulating film, the first gate stacked insulating film includes one or more first ferroelectric material films, the second gate stacked insulating film includes a plurality of second ferroelectric material films, and the number of the second ferroelectric material films is greater than or equal to the number of the first ferroelectric material films.

According to another aspect of the present disclosure, there is provided a semiconductor device comprising, a substrate including a first region and a second region, a first gate stack on the first region and including a first interface film of a first thickness, a first gate stacked insulating film on the first interface film, and a first gate electrode on the first gate stacked insulating film, and a second gate stack on the second region and including a second interface film of a second thickness smaller than the first thickness, a second gate stacked insulating film on the second interface film, and a second gate electrode on the second gate stacked insulating film, wherein a width of the first gate stack is greater than a width of the second gate stack, the first gate stacked insulating film includes one or more first ferroelectric material films and a plurality of first paraelectric material films, the second gate stacked insulating film includes a plurality of second ferroelectric material films and a plurality of second paraelectric material films, and the number of the second ferroelectric material films is greater than or equal to the number of the first ferroelectric material films.

Aspects of the embodiments of the inventive concepts are not restricted to the ones set forth herein. The above and other aspects of the embodiments of the inventive concepts will become more apparent to one of ordinary skill in the art to which the present disclosure pertains by referencing the detailed description given below.

DETAILED DESCRIPTION OF THE EMBODIMENTS

Figure 1:
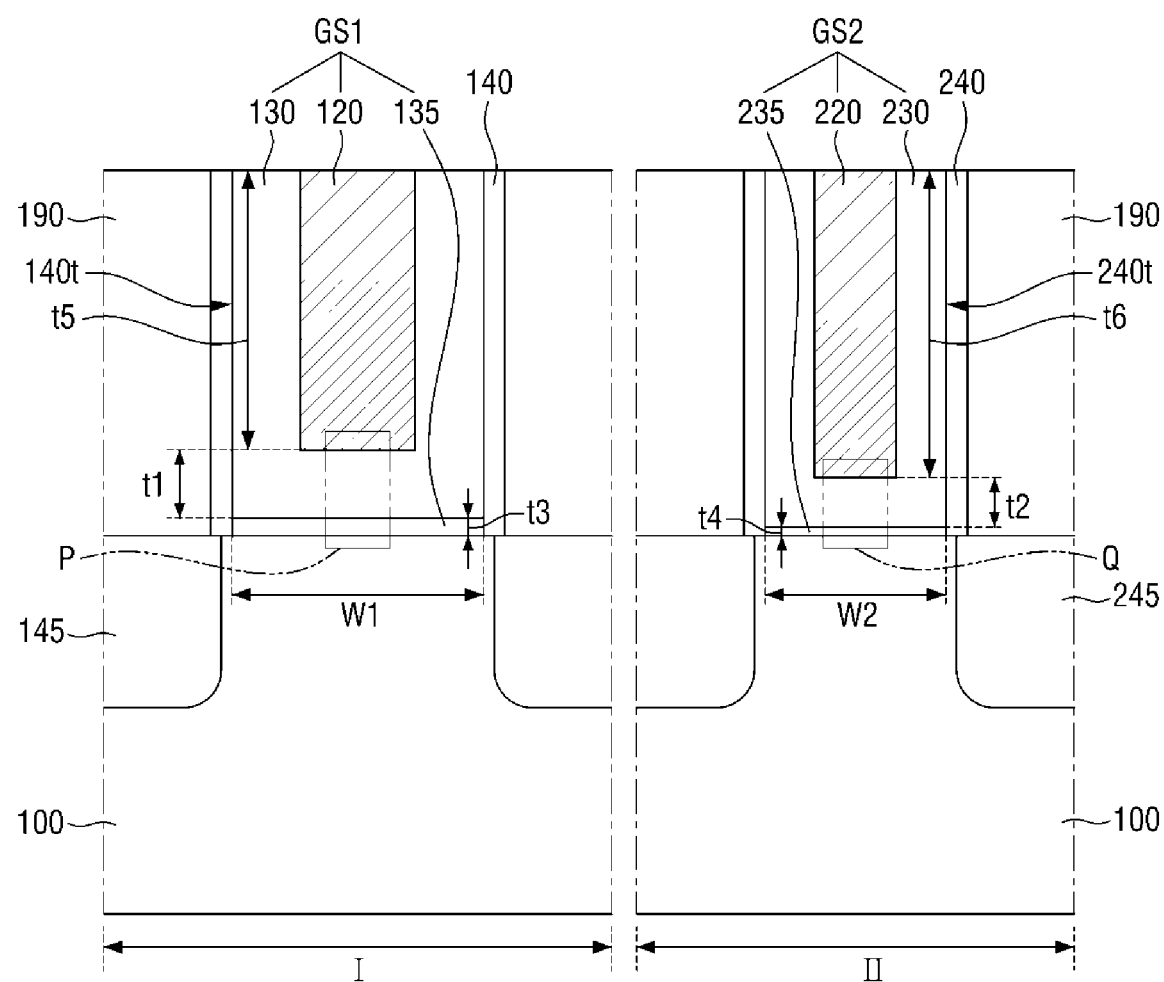
FIG. 1 is a cross-sectional view of a semiconductor device according to some example embodiments of the inventive concept.

Hereinafter, embodiments of the inventive concept will be described in detail with reference to the accompanying drawings. The same reference numerals are used for the same elements in the drawings, and redundant descriptions thereof will be omitted. As used herein, the term "and/or" includes any and all combinations of one or more of the associated listed items. It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

Although a planar transistor including a channel region of a fin-type pattern shape, a fin-type transistor (FinFET), a transistor including a nanowire or a nanosheet or a vertical transistor (Vertical FET) are, for example, shown in the drawings of a semiconductor device according to some embodiments of the inventive concept, it will be understood that embodiments of the inventive concept are not limited thereto. Embodiments of the inventive concept may also be applied to 2D material based FETs and heterostructures thereof, and a FeFET (ferroelectric FET), for example.

Further, semiconductor devices according to some embodiments may include a tunneling transistor (tunneling FET). Semiconductor devices according to some embodiments of the inventive concept may also include a bipolar junction transistor, a laterally diffused metal oxide semiconductor (LDMOS), and the like.

Figure 2:
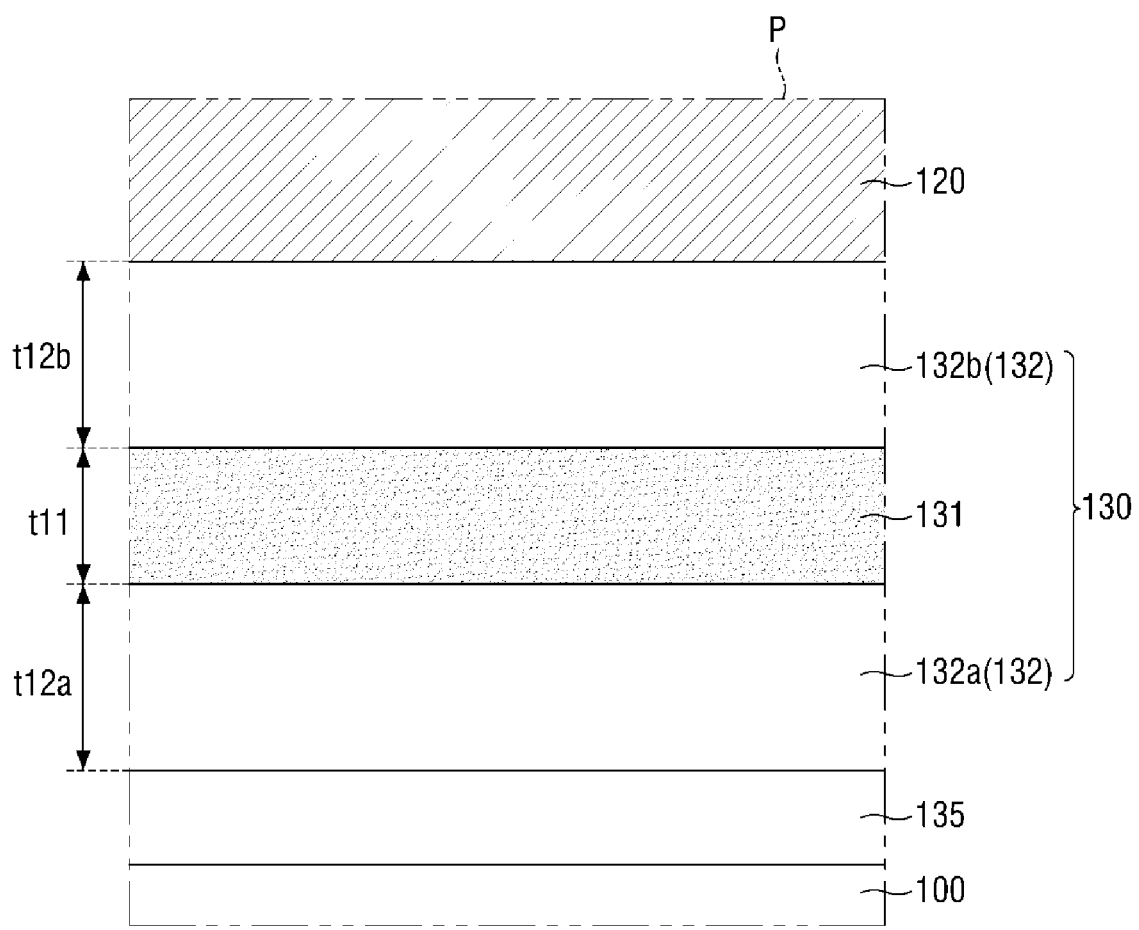
FIG. 2 is an enlarged view of a part P of FIG. 1 according to some example embodiments of the inventive concept.
Figure 3:
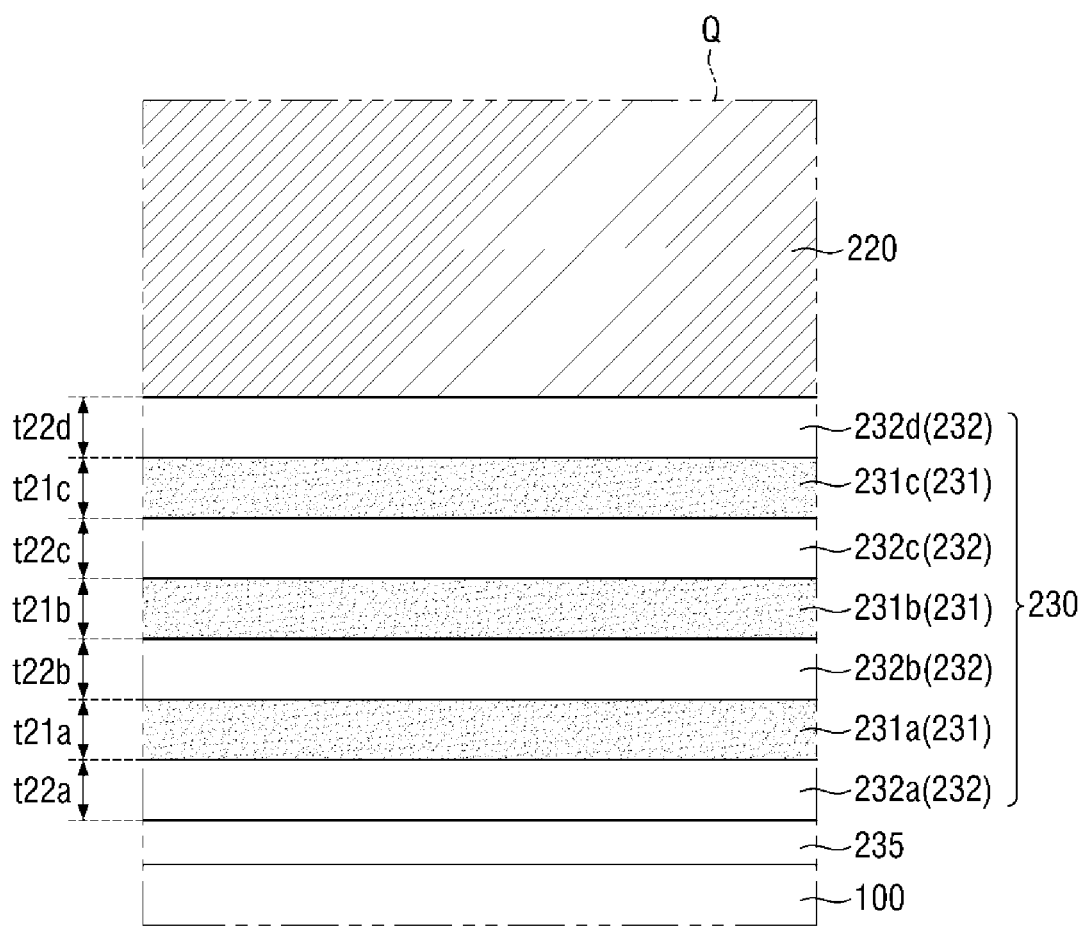
FIG. 3 is an enlarged view of a part Q of FIG. 1 according to some example embodiments of the inventive concept.

FIG. 1 is a cross-sectional view that illustrates a semiconductor device according to some example embodiments of the inventive concept. FIG. 2 is an enlarged view of a part P of FIG. 1. FIG. 3 is an enlarged view of a part Q of FIG. 1. For convenience of explanation, element isolation films, such as a STI (shallow trench isolation), formed in the substrate will be omitted.

Referring to FIGS. 1 to 3, a semiconductor device according to some embodiments includes a first gate stack GS1 and a second gate stack GS2.

The substrate 100 may include a first region I and a second region II. In the semiconductor device according to some embodiments, the first region I may be a high-voltage operating region and the second region II may be a low-voltage operating region.

For example, the first region I may be an I/O region, and the second region II may be a logic region or a memory region. For example, the memory region may be an SRAM region. A conductivity type of the transistor formed in the first region I may be the same as or different from that of the transistor formed in the second region II.

The substrate 100 may be a silicon substrate or an SOI (silicon-on-insulator). In other embodiments, the substrate 100 may include, but is not limited to, silicon germanium, SGOI (silicon germanium on insulator), indium antimonide, lead tellurium compound, indium arsenide, indium phosphide, gallium arsenide or gallium antimonide.

In other embodiments, unlike the example semiconductor device illustrated in FIG. 1, the substrate 100 may include a base substrate, and a channel film disposed on the base substrate. The channel film may include a material different from the base substrate. The channel film may include a material having semiconductor properties. At least some of the source/drain regions 145 and 245, which are described below, may be formed in the channel film.

As an example, the channel film may include silicon or germanium, which is an elemental semiconductor material. As another example, the channel film may include a compound semiconductor, and may include, for example, a group IV-IV compound semiconductor or a group III-V compound semiconductor. The group IV-IV compound semiconductor may be, for example, a binary compound and/or a ternary compound including at least two or more of carbon (C), silicon (Si), germanium (Ge), and tin (Sn) or a compound obtained by doping these elements with a group IV element. The group III-V compound semiconductor may be, for example, one of a binary compound, a ternary compound or a quaternary compound formed by combining at least one of aluminum (Al), gallium (Ga) and indium (In) as a group III element, with one of phosphorus (P), arsenic (As) and antimony (Sb) as a group V element.

As still another example, the channel film may include a two-dimensional (2D) material. The two-dimensional material may include a two-dimensional allotrope or a two-dimensional compound, and may include, for example, but is not limited to, at least one of graphene, molybdenum disulfide ($MoS_2$), molybdenum diselenide ($MoSe_2$), tungsten diselenide ($WSe_2$), and/or tungsten disulfide ($WS_2$).

As still another example, the channel film may include an amorphous metal oxide, a polycrystalline metal oxide, a combination of the amorphous metal oxide and the polycrystalline metal oxide, or the like. Examples of the metal oxide may include, but are not limited to, one of indium oxide, tin oxide, zinc oxide, In—Zn-based oxide (IZO), Sn—Zn-based oxide, Ba—Sn-based oxide, Al—Zn-based oxide, Zn—Mg-based oxide, Sn—Mg-based oxide, In—Mg-based oxide, In—Ga-based oxide (IGO), In—Ga—Zn-based oxide (IGZO), In—Al—Zn-based oxide, In—Sn—Zn-based oxide (ITZO), In—W—Zn-based oxide (IWZO), Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and/or In—Hf—Al—Zn-based oxide.

The aforementioned channel film may be disposed in both the first region I and the second region II, and may be disposed in one of the first region I and the second region II.

Each of a first gate stack GS1 and a second gate stack GS2 may include a ferroelectric material film having a ferroelectric property, and a paraelectric material film having a paraelectric property. The ferroelectric material film may have a negative capacitance, and the paraelectric material film may have a positive capacitance.

In general, when two or more capacitors are connected in series and the capacitance of each capacitor has a positive value, the overall capacitance decreases compared to the capacitance of each individual capacitor. Conversely, when at least one of the capacitances of the two or more capacitors connected in series has a negative value, the overall capacitance may be greater than each individual capacitance, while having a positive value.

That is, by connecting the ferroelectric material film having a negative capacitance and the paraelectric material film having a positive capacitance in series, the overall capacitance value may increase. By utilizing an increase in the overall capacitance value, the transistor including the ferroelectric material film may have a subthreshold swing SS of less than 60 mV/decade at room temperature. The transistor including the ferroelectric material film may be an NC (Negative Capacitance) FET.

The first gate stack GS1, the first gate spacer 140 and a first source/drain region 145 may be disposed in the first region I. The second gate stack GS2, the second gate spacer 240 and a second source/drain region 245 may be disposed in the second region II.

The first gate spacer 140 and the second gate spacer 240 may be disposed on the substrate 100, respectively. Although each of the first gate spacer 140 and the second gate spacer 240 is shown as a single layer, they may be formed of multi-layers in other embodiments, without being limited thereto.

The first gate spacer 140 and the second gate spacer 240 may include, for example, at least one of silicon nitride (SiN), silicon oxynitride (SiON), silicon oxide (SiO$_2$), silicon oxycarbonitride (SiOCN), silicon boron nitride (SiBN), silicon boron oxynitride (SiOBN), silicon oxycarbide (SiOC), and combinations thereof.

Further, in some cases, the first gate spacer 140 and the second gate spacer 240 may include a material having an etching selection ratio with respect to an interlayer insulating film 190.

A first gate trench 140t may be defined by the first gate spacer 140. A second gate trench 240t may be defined by the second gate spacer 240. Sidewalls of the first gate trench 140t may be defined by the first gate spacer 140. The second gate trench 240t may be defined by the second gate spacer 240.

The first gate stack GS1 may be disposed on the substrate 100. The first gate stack GS1 may be disposed in the first gate trench 140t. The first gate stack GS1 may include a first interface film 135, a first gate stacked insulating film 130, and a first gate electrode 120.

The first interface film 135 may be formed on the substrate 100. The first interface film 135 may be formed along a bottom surface of the first gate trench 140t.

Although the first interface film 135 is shown as not being formed on the sidewall of the first gate trench 140t, embodiments of the inventive concept are not limited thereto. Depending on the method of forming the first interface film 135, the first interface film 135 may also be formed on the sidewall of the first gate trench 140t.

The first gate stacked insulating film 130 may be disposed on the first interface film 135. The first gate stacked insulating film 130 may be formed along the sidewall and bottom surface of the first gate trench 140t.

The first gate stacked insulating film 130 may include at least one or more first ferroelectric material films 131, and a plurality of first paraelectric material films 132. The first gate stacked insulating film 130 may have a stacked film structure in which the first paraelectric material films 132 and the first ferroelectric material films 131 are alternately formed.

Adjacent first paraelectric material films 132 may be spaced apart from each other. Adjacent first paraelectric material films 132 may be spaced apart from each other by the first ferroelectric material film 131. Further, when there is a plurality of first ferroelectric material films 131, the adjacent first ferroelectric material films 131 may be spaced apart from each other. Adjacent first ferroelectric material films 131 may be spaced apart from each other by the first paraelectric material film 132.

In a semiconductor device according to some embodiments, the first gate stacked insulating film 130 may include one first ferroelectric material film 131, and two first paraelectric material films 132. The first paraelectric material film 132 may include a first_1 paraelectric material film 132a, and a first_2 paraelectric material film 132b.

As an example, the number of first ferroelectric material films 131 may differ from the number of first paraelectric material films 132. For example, the first gate stacked insulating film 130 closest to the first interface film 135 may be the first paraelectric material film 132. The first gate stacked insulating film 130 closest to the first gate electrode 120 may be the first paraelectric material film 132.

Unlike the example embodiment shown in FIG. 1, when the first interfacial film 135 and the first paraelectric material film 132 include the same material, the first interface film 135 between the first gate stacked insulating film 130 and the substrate 100 may be omitted.

The first gate electrode 120 may be disposed on the first gate stacked insulating film 130. The first gate electrode 120 may at least partially fill the first gate trench 140t.

In a semiconductor device according to some embodiments, the first gate electrode 120 may not be on and/or cover an uppermost surface of the first gate stacked insulating film 130.

A second interface film 235 may be formed on the substrate 100. The second interface film 235 may be formed along the bottom surface of the second gate trench 240t.

Although the second interface film 235 is shown as not being formed on the sidewall of the second gate trench 240t, embodiments of the inventive concept are not limited thereto. Depending on the method of forming the second interface film 235, the second interface film 235 may also be formed on the sidewall of the second gate trench 240t.

The second gate stacked insulating film 230 may be disposed on the second interface film 235. The second gate stacked insulating film 230 may be formed along the sidewall and bottom surface of the second gate trench 240t.

The second gate stacked insulating film 230 may include a plurality of second ferroelectric material films 231, and a plurality of second paraelectric material films 232. The second gate stacked insulating film 230 may have a stacked film structure in which the second paraelectric material films 232 and the second ferroelectric material films 231 are alternately formed.

The second ferroelectric material film 231 may include a second_1 ferroelectric material film 231a, a second_2 ferroelectric material film 231b, and a second_3 ferroelectric material film 231c. The second paraelectric material film 232 may include a second_1 paraelectric material film 232a, a second_2 paraelectric material film 232b, a second_3 paraelectric material film 232c, and a second_4 paraelectric material film 232d.

Adjacent second paraelectric material films 232 may be spaced apart from each other. Adjacent second paraelectric material films 232 may be spaced apart from each other by the second ferroelectric material film 231. Adjacent second ferroelectric material films 231 may be spaced apart from each other. Adjacent second ferroelectric material films 231 may be spaced apart from each other by the second paraelectric material film 232.

As an example, the number of second ferroelectric material films 231 may be different than the number of second paraelectric material films 232. For example, the second gate stacked insulating film 230 closest to the second interface film 235 may be the second paraelectric material film 232. The second gate stacked insulating film 230 closest to the second gate electrode 220 may be the second paraelectric material film 232.

Unlike the example embodiments shown in FIG. 1, when the second interface film 235 and the second paraelectric material film 232 include the same material, the second interface film 235 between the second gate stacked insulating film 230 and the substrate 100 may be omitted.

Although the second gate stacked insulating film 230 is shown to include three second ferroelectric material films 231 spaced apart from each other, this is only for convenience of illustration, and embodiments of the inventive concept are not limited thereto. Unlike the example embodiments shown in FIG. 1, the second gate stacked insulating film 230 may include two second ferroelectric material films 231 spaced apart from each other. In other embodiments, the second gate stacked insulating film 230 may include four or more second ferroelectric material films 231 spaced apart from each other.

The second gate electrode 220 may be disposed on the second gate stacked insulating film 230. The second gate electrode 220 may at least partially fill the second gate trench 240t.

In a semiconductor device according to some embodiments, the second gate electrode 220 may not be on and/or cover the uppermost surface of the second gate stacked insulating film 230.

In a semiconductor device according to some embodiments, the number of the first ferroelectric material films 131 included in the first gate stacked insulating film 130 may be less than the number of the second ferroelectric material films 231 included in the second gate stacked insulating film 230.

The first interface film 135 and the second interface film 235 may each include, for example, but not limited to, silicon oxide. Each of the first interface film 135 and the second interface film 235 may include different materials based on the type of the substrate 100. When the substrate 100 includes the channel film as described above, the first interface film 135 and the second interface film 235 may include a material different from the silicon oxide based on the type of the channel film.

Each of the first ferroelectric material film 131 and the second ferroelectric material film 231 may include a hafnium oxide (HfO)-based material. The hafnium oxide-based material may include not only hafnium oxide, but also a material in which a dopant is included in the hafnium oxide. The hafnium oxide-based materials may have a stoichiometric formula or a non-stoichiometric formula.

When the hafnium oxide-based material includes crystal grains having an orthorhombic crystal system, the hafnium oxide-based material may have ferroelectric properties. Each of the first ferroelectric material film 131 and the second ferroelectric material film 231 may include crystal grains having the orthorhombic crystal system.

Each of the first ferroelectric material film 131 and the second ferroelectric material film 231 may include a dopant doped in hafnium oxide (HfO). The dopant may include at least one of gadolinium (Gd), silicon (Si), zirconium (Zr), aluminum (Al), and yttrium (Y).

When the dopant is aluminum (Al), each of the first ferroelectric material film 131 and the second ferroelectric material film 231 may include aluminum of 3 to 8 at % (atomic %). Here, the ratio of the dopant may be a ratio of aluminum to the sum of hafnium and aluminum. Further, in the process of fabricating the first ferroelectric material film 131 and the second ferroelectric material film 231 doped with aluminum, each of the first ferroelectric material film 131 and the second ferroelectric material film 132 may be annealed at 800 to 1000° C.

When the dopant is silicon (Si), each of the first ferroelectric material film 131 and the second ferroelectric material film 231 may include silicon of 2 to 10 at %. Further, in the process of fabricating the first ferroelectric material film 131 and the second ferroelectric material film 231 doped with silicon, each of the first ferroelectric material film 131 and the second ferroelectric material film 231 may be annealed at 650 to 1000° C.

When the dopant is yttrium (Y), each of the first ferroelectric material film 131 and the second ferroelectric material film 231 may include yttrium of 2 to 10 at %. Further, in the process of fabricating the first ferroelectric material film 131 and the second ferroelectric material film 231 doped with yttrium, each of the first ferroelectric material film 131 and the second ferroelectric material film 231 may be annealed at 600 to 1000° C.

When the dopant is gadolinium (Gd), each of the first ferroelectric material film 131 and the second ferroelectric material film 231 may include gadolinium of 1 to 7 at %. Also, in the process of fabricating the first ferroelectric material film 131 and the second ferroelectric material film 231 doped with gadolinium, each of the first ferroelectric material film 131 and the second ferroelectric material film 231 may be annealed at 450 to 800° C.

When the dopant is zirconium (Zr), each of the first ferroelectric material film 131 and the second ferroelectric material film 231 may include zirconium of 50 to 80 at %. Further, in the process of fabricating the first ferroelectric material film 131 and the second ferroelectric material film 231 doped with zirconium, each of the first ferroelectric material film 131 and the second ferroelectric material film 231 may be annealed at 400 to 550° C.

As an example, the first ferroelectric material film 131 may include the same material as the second ferroelectric material film 231. For example, the dopant included in the first ferroelectric material film 131 may be the same as the dopant included in the second ferroelectric material film. In other embodiments, the first ferroelectric material film 131 and the second ferroelectric material film 231 may not include the aforementioned dopant.

As another example, the first ferroelectric material film 131 may include a material different from the second ferroelectric material film 231.

In a semiconductor device according to some embodiments, each of the first ferroelectric material film 131 and the second ferroelectric material film 231 may have a thickness of 0.5 to 10 nm. For example, a thickness t21a of each second_1 ferroelectric material film 231a, a thickness t21b of each second_2 ferroelectric material film 231b, and a thickness t21c of each second_3 ferroelectric material film 231c may be 0.5 to 10 nm.

Each of the first paraelectric material film 132 and the second paraelectric material film 232 may include, for example, at least one of silicon oxide (SiO) and/or metal oxide. The metal oxide included in the first paraelectric material film 132 and the second paraelectric material film 232 may have a paraelectric property. The metal oxide may include, for example, but is not limited to, at least one of hafnium oxide (HfO) and/or zirconium oxide (ZrO). If each of the first paraelectric material film 132 and the second paraelectric material film 232 includes hafnium oxide, the hafnium oxide included in the first paraelectric material film 132 and the second paraelectric material film 232 may have the paraelectric property.

In a semiconductor device according to some embodiments, each of the first paraelectric material film 132 and the second paraelectric material film 232 may have a thickness of 0.5 to 10 nm. For example, the thickness t12a of the first_1 paraelectric material film 132a, the thickness t12b of the first_2 paraelectric material film 132b, the thickness t22a of the second_1 paraelectric material film 232a, the thickness t22b of the second_2 paraelectric material film 232b, the thickness t22c of the second_3 paraelectric material film 232c, and the thickness t22d of the second_4 paraelectric material film 232d may be 0.5 to 10 nm.

Each of the first gate electrode 120 and the second gate electrode 220 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co) titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh) palladium (Pd), iridium (Ir), osmium (O), silver (Ag), gold (Au), zinc (Zn), vanadium (V) and combinations thereof.

The first source/drain region 145 may be disposed on both sides of the first gate stack GS1. The second source/drain region 245 may be disposed on both sides of the second gate stack GS2.

In a semiconductor device according to some embodiments, a width W1 of the first gate stack GS1 is greater than a width W2 of the second gate stack GS2. The width W1 of the first gate stack GS1 is a width of the first gate stack GS1 between the adjacent first source/drain regions 145 as shown in FIG. 1. A width W2 of the second gate stack GS2 is a width of the second gate stack GS2 between the adjacent second source/drain regions 245 as shown in FIG. 1.

In a semiconductor device according to some example embodiments, a thickness t3 of the first interface film 135 is greater than a thickness t4 of the second interface film 235.

In a semiconductor device according to some example embodiments, a thickness t5 of the first gate electrode 120 in a thickness direction of the substrate 100 may be less than a thickness t6 of the second gate electrode 220 in the thickness direction of the substrate 100, i.e., a vertical direction in a cross-sectional view of the semiconductor device as shown in FIG. 1.

In a semiconductor device according to some example embodiments, the thickness t1 of the first gate stacked insulating film 130 on the bottom surface of the first gate trench 140t may be greater than the thickness t2 of the second gate stacked insulating film 230 on the bottom surface of the second gate trench 240t.

The thickness t1 of the first gate stacked insulating film 130 may be the sum of the thickness t12a of the first_1 paraelectric material film 132a, the thickness t12b of the first_2 paraelectric material film 132b, and the thickness t11 of the first ferroelectric material film 131.

As an example, the thickness t12a of the first_1 paraelectric material film 132a may be the same as the thickness t12b of the first_2 paraelectric material film 132b. As another example, the thickness t12a of the first_1 paraelectric material film 132a may be different from the thickness t12b of the first_2 paraelectric material film 132b.

The thickness t2 of the second gate stacked insulating film 230 may be the sum of the thickness t22a of the second_1 paraelectric material film 232a, the thickness t22b of the second_2 paraelectric material film 232b, the thickness t22c of the second_3 paraelectric material film 232c, the thickness t22d of the second_4 paraelectric material film 232d, the thickness t21a of the second_1 ferroelectric material film 231a, the thickness t21b of the second_2 ferroelectric material film 231b, and the thickness t21c of the second_3 ferroelectric material film 231c.

At least two or more of the second_1 ferroelectric material film 231a, the second_2 ferroelectric material film 231b, and the second_3 ferroelectric material film 231c may have the same thicknesses as each other, or all of them may have different thicknesses. At least two or more of the second_1 paraelectric material film 232a, the second_2 paraelectric material film 232b, the second_3 paraelectric material film 232c, and the second_4 paraelectric material film 232d may have the same thicknesses as each other, or all of them may have different thicknesses.

An average thickness of the first paraelectric material film 132 may be an average of the thickness t12a of the first_1 paraelectric material film 132a and the thickness t12b of the first_2 paraelectric material film 132b.

In a semiconductor device according to some example embodiments, the average thickness of the first paraelectric material film 132 may be greater than the average thickness of the second paraelectric material film 232.

In a semiconductor device according to some example embodiments, the thickness t11 of the first ferroelectric material film 131 may be greater than or equal to the average thickness of the second ferroelectric material film 231. Here, the "same thickness" means not only an example where the two thicknesses to be compared are exactly the same, but also where a minute difference in thickness may occur due to process margins or measurement process margins.

The interlayer insulating film 190 may be formed on the substrate 100. The interlayer insulating film 190 may border and/or surround the outer wall of the first gate spacer 140 and the outer wall of the second gate spacer 240. The interlayer insulating film 190 may be on and at least partially cover a first source/drain region 145 and a second source/drain region 245. The upper surface of the first gate electrode 120 may be placed on the same plane as the upper surface of the interlayer insulating film 190 in a cross-sectional view of the semiconductor device as shown in FIG. 1. The upper surface of the second gate electrode 220 may be placed on the same plane as the upper surface of the interlayer insulating film 190.

The interlayer insulating film 190 may include at least one of silicon oxide, silicon nitride, silicon oxynitride, and/or a low-dielectric constant material. The low-dielectric constant materials may include, for example, but are not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyClo-TetraSiloxane (OMCTS), HexaMethylDiSiloxane (HMDS), TriMethylSilyl Borate (TMSB), DiAcetoxyDitertiaryButo-Siloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

A second gate stack GS2 of the second region II may include a plurality of second ferroelectric material films 231. As the number of the second ferroelectric material films 231 in the second gate stack GS2 increases, the subthreshold swing (SS) of the transistor including the second gate stack GS2 may decrease. If the subthreshold swing (SS) decreases, a drive voltage Vdd of the transistor may decrease.

In addition, because the first gate stack GS1 of the first region I includes the first ferroelectric material film 131, the subthreshold swing (SS) of the transistor including the first gate stack GS1 may decrease. The average thickness of the first paraelectric material film 132 included in the first gate stack GS1 may be greater than the average thickness of the second paraelectric material film 232 included in the second gate stack GS2. As a result, the reliability of the transistor including the first gate stack GS1 may be improved.

Figure 4:
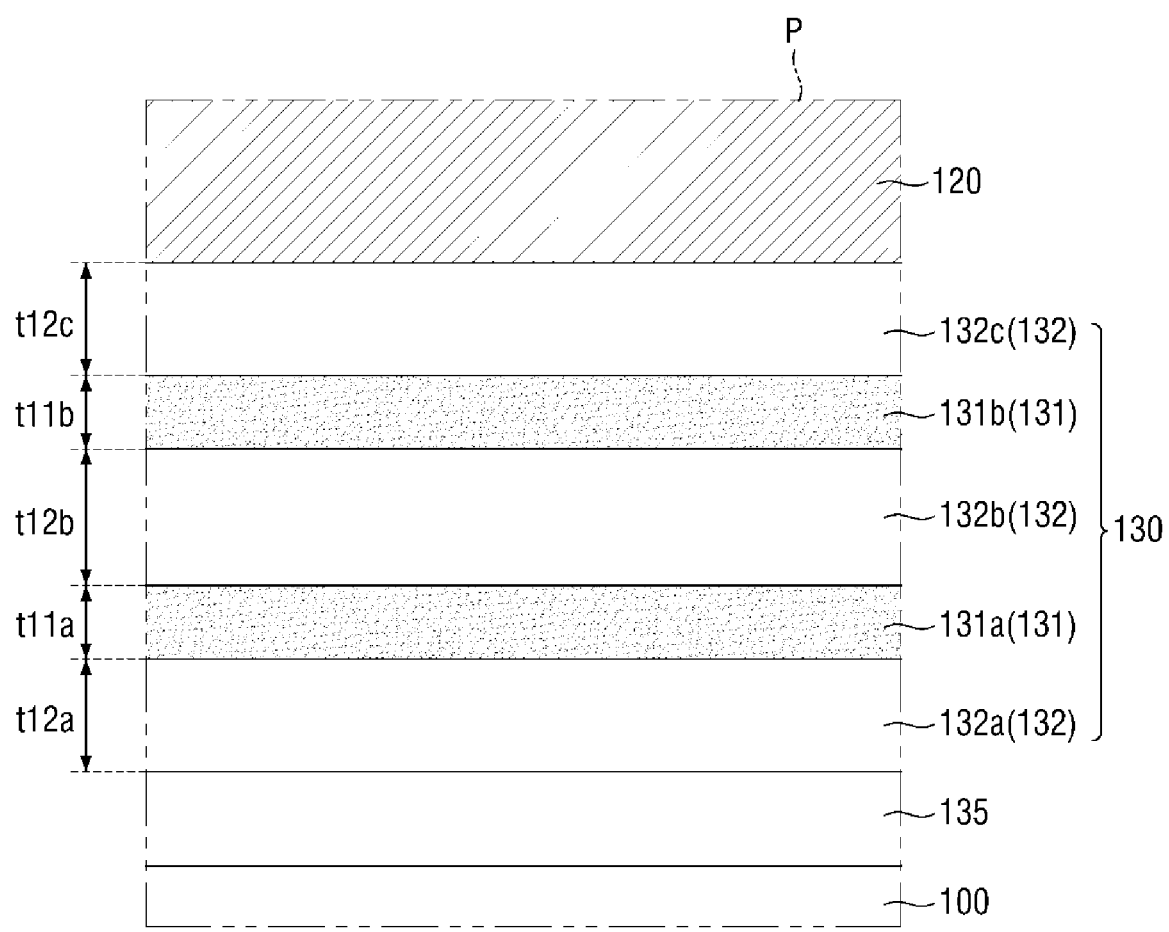
FIGS. 4-6 are enlarged views of the part P of FIG. 1 according to some example embodiments of the inventive concept.

FIG. 4 is a diagram that illustrates a semiconductor device according to some example embodiments. For convenience of explanation, features that are different from those described using FIGS. 1 to 3 will be of primary focus. For reference, FIG. 4 is an enlarged view of a part P of FIG. 1.

Referring to FIG. 4, in a semiconductor device according to some embodiments, the first gate stacked insulating film 130 may include a plurality of first ferroelectric material films 131.

The first ferroelectric material film 131 may include a first_1 ferroelectric material film 131a, and a first_2 ferroelectric material film 131b. The first paraelectric material film 132 may include a first_1 paraelectric material film 132a, a first_2 paraelectric material film 132b, and a first_3 paraelectric material film 132c.

Even if the first gate stacked insulating film 130 includes a plurality of first ferroelectric material films 131, the number of the first ferroelectric material films 131 included in the first gate stacked insulating film 130 may be less than the number of second ferroelectric material films 231 included in the second gate stacked insulating film 230.

Each of the thickness t11a of the first_1 ferroelectric material films 131a and the thickness t21b of the first_2 ferroelectric material film 131b may be 0.5 to 10 nm. As an example, the thickness t11a of the first_1 ferroelectric material film 131a may be the same as the thickness t11b of the first_2 ferroelectric material film 131b. As another example, the thickness t11a of the first_1 ferroelectric material film 131a may be different from the thickness t11b of the first_2 ferroelectric material film 131b.

The thickness of the first gate stacked insulating film 130 may be the sum of the thickness t12a of the first_1 paraelectric material film 132a, the thickness t12b of the first_2 paraelectric material film 132b, the thickness t12c of the first_3 paraelectric material film 132c, the thickness t11a of the first_1 ferroelectric material film 131a, and the thickness t11b of the first_2 ferroelectric material film 131b.

In a semiconductor device according to some example embodiments, the average thickness of the first ferroelectric material film 131 may be greater than or equal to the average thickness of the second ferroelectric material film 231.

Figure 5:
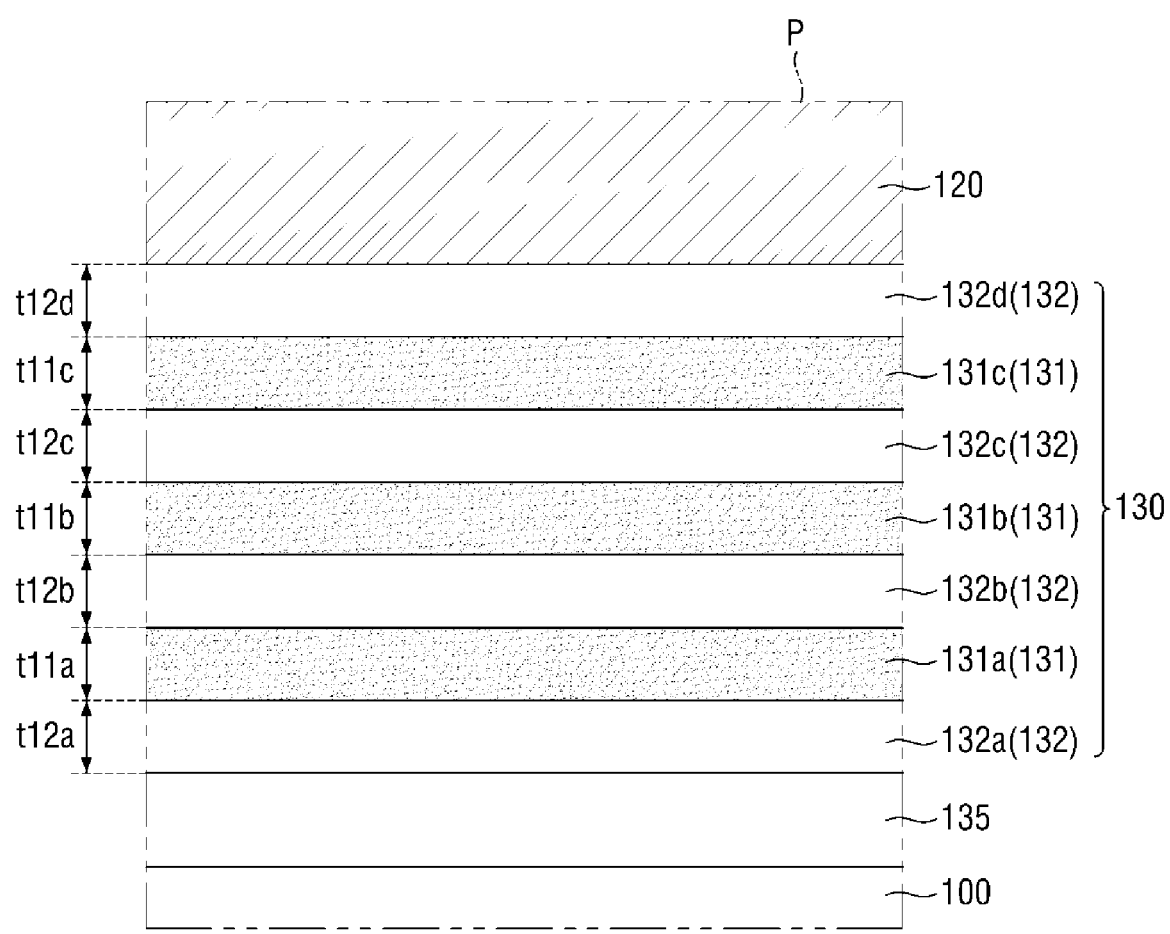

FIG. 5 is a diagram that illustrates a semiconductor device according to some example embodiments. For convenience of explanation, features that are different from those described using FIGS. 1, 3, and 4 will be of primary focus. For reference, FIG. 5 is an enlarged view of a part P of FIG. 1.

Referring to FIG. 5, in a semiconductor device according to some embodiments, the number of the first ferroelectric material films 131 included in the first gate stacked insulating film 130 may be equal to the number of the second ferroelectric material films 231 included in the second gate stacked insulating film 230.

The first ferroelectric material film 131 may include a first_1 ferroelectric material film 131a, a first_2 ferroelectric material film 131b, and a first_3 ferroelectric material film 131c. The first paraelectric material film 132 may include a first_1 paraelectric material film 132a, a first_2 paraelectric material film 132b, a first_3 paraelectric material film 132c, and a first_4 paraelectric material film 132d.

The thickness of the first gate stacked insulating film 130 may be the sum of the thickness t12a of the first_1 paraelectric material film 132a, the thickness t12b of the first_2 paraelectric material film 132b, the thickness t12c of the first_3 paraelectric material film 132c, the thickness t12d of the first_4 paraelectric material film 132d, the thickness t11a of the first_1 ferroelectric material film 131a, the thickness t11b of the first_2 ferroelectric material film 131b, and the thickness t11c of the first_3 ferroelectric material film 131c.

Figure 6:
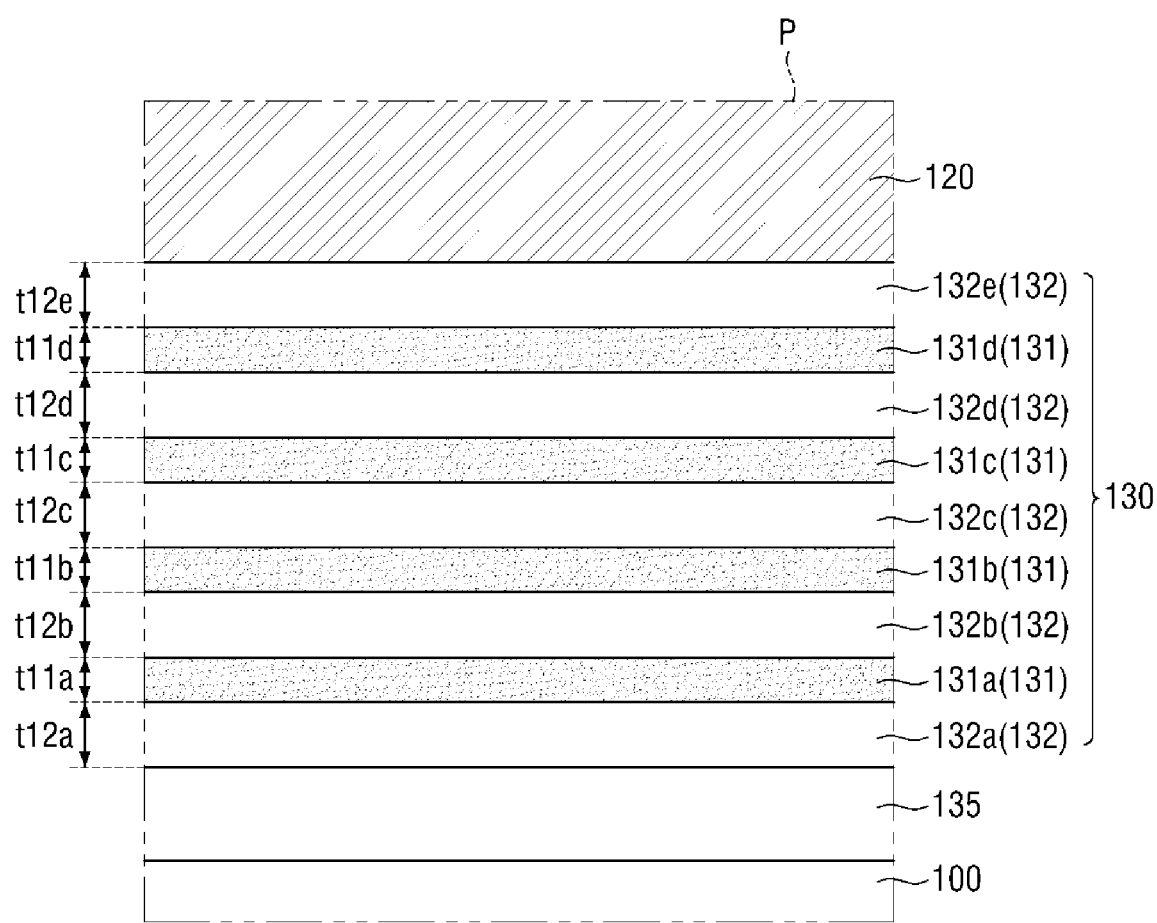

FIG. 6 is a diagram that illustrates a semiconductor device according to some example embodiments. For convenience of explanation, features that are different from those described using FIGS. 1, 3, and 4 will be of primary focus. For reference, FIG. 6 is an enlarged view of a part P of FIG. 1.

Referring to FIG. 6, in a semiconductor device according to some embodiments, the number of the first ferroelectric material films 131 included in the first gate stacked insulating film 130 may be greater than the number of second ferroelectric material films 231 included in the second gate stacked insulating film 230.

The first ferroelectric material film 131 may include a first_1 ferroelectric material film 131a, a first_2 ferroelectric material film 131b, a first_3 ferroelectric material film 131c, and a first_4 ferroelectric material film 131d. The first paraelectric material film 132 may include a first_1 paraelectric material film 132a, a first_2 paraelectric material film 132b, a first_3 paraelectric material film 132c, a first_4 paraelectric material film 132d, and a first 5 paraelectric material film 132e.

The thickness of the first gate stacked insulating film 130 may be the sum of the thickness t12a of the first_1 paraelectric material film 132a, the thickness t12b of the first_2 paraelectric material film 132b, the thickness t12c of the first_3 paraelectric material film 132c, the thickness t12d of the first_4 paraelectric material film 132d, the thickness t12e of the first_5 paraelectric material film 132e, the thickness t11a of the first_1 ferroelectric material film 131a, the thickness t11b of the first_2 ferroelectric material film 131b, the thickness t11c of the first_3 ferroelectric material film 131c, and the thickness t11d of the first_4 ferroelectric material film 131d.

In a semiconductor device according to some example embodiments, the average thickness of the first ferroelectric material film 131 may be substantially the same as the average thickness of the second ferroelectric material film 231.

Figure 7:
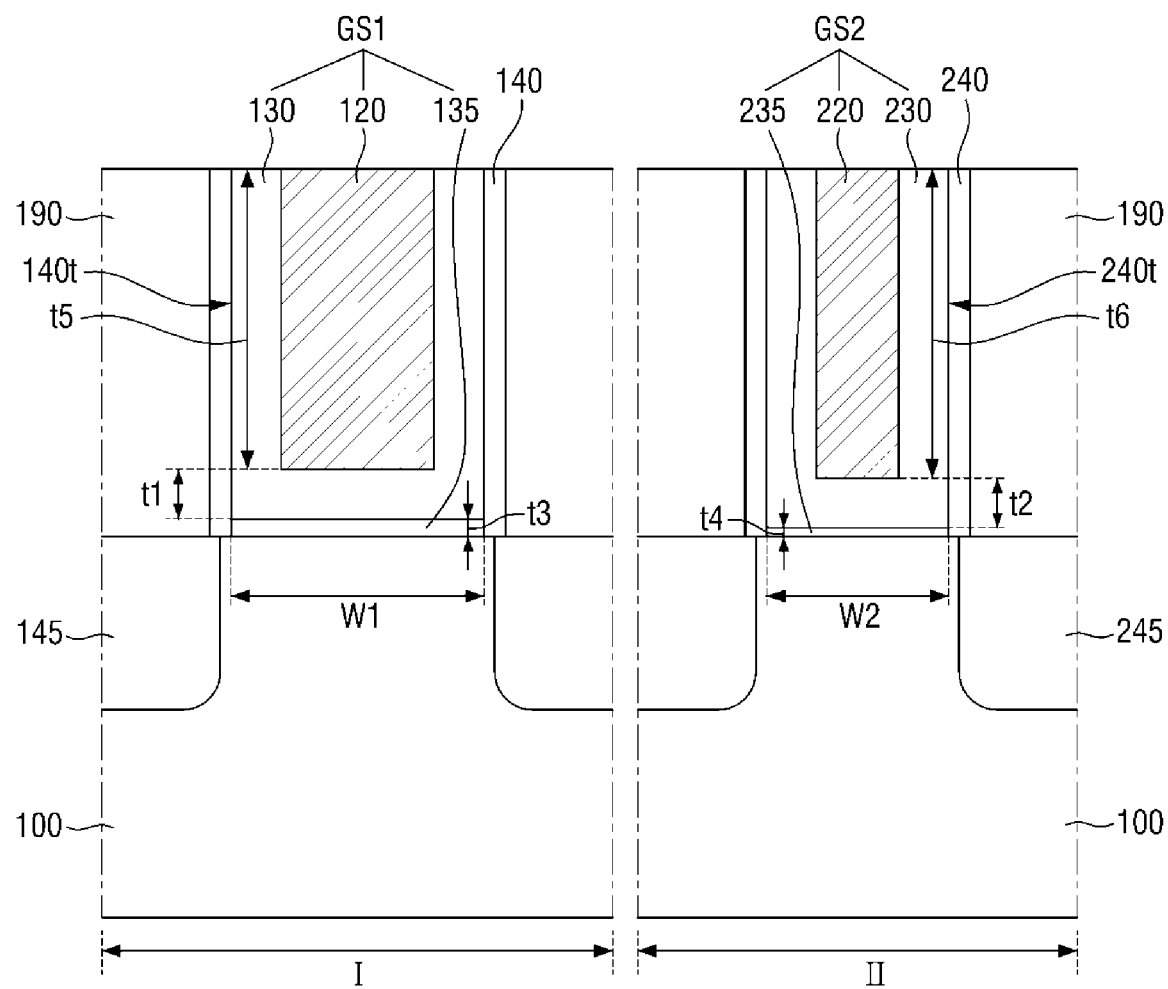
FIGS. 7-13 are cross-sectional views of semiconductor devices according to further example embodiments of the inventive concept.

FIG. 7 is a diagram that illustrates a semiconductor device according to some example embodiments. For convenience of explanation, features that are different from those described using FIGS. 1 to 4 will be of primary focus.

For reference, a structure of the first gate stacked insulating film 130 may be as one of the embodiments illustrated in FIGS. 2 and 4, and a structure of the second gate stacked insulating film 230 may be as shown in the embodiment of FIG. 3.

Referring to FIG. 7, in a semiconductor devices according to some embodiments, the thickness t1 of the first gate stacked insulating film 130 on the bottom surface of the first gate trench 140t may be substantially the same as the thickness t2 of the second gate stacked insulating film 230 on the bottom surface of the second gate trench 240t.

The number of the first ferroelectric material films 131 included in the first gate stacked insulating film 130 may be less than the number of the second ferroelectric material films 231 included in the second gate stacked insulating film 230.

In the example embodiments of FIG. 2, the average thickness of the first ferroelectric material film 131 may be greater than or equal to the average thickness of the second ferroelectric material film 231. The average thickness of the first paraelectric material film 132 may be greater than the average thickness of the second paraelectric material film 232.

Figure 8:
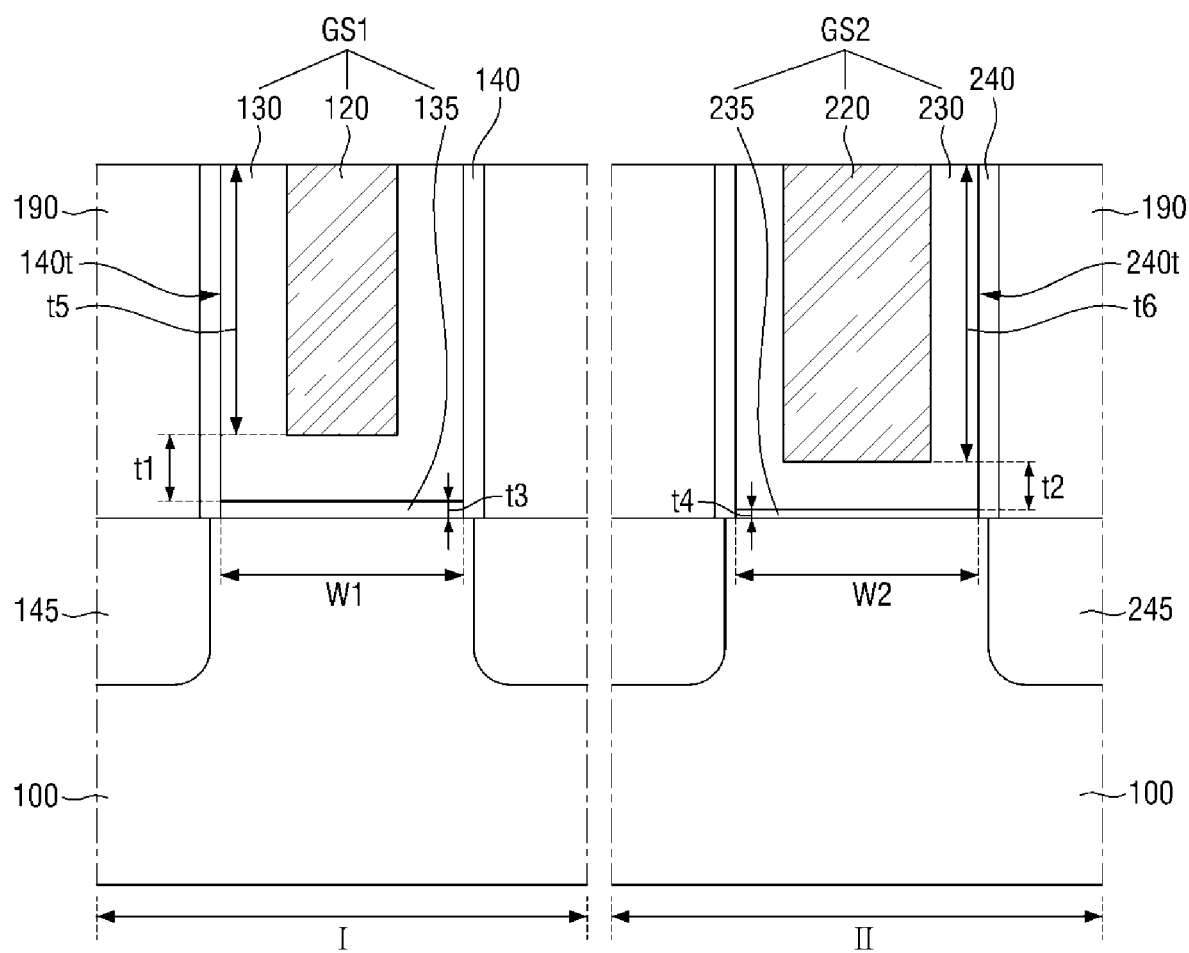

FIG. 8 is a cross-sectional that illustrates a semiconductor device according to some example embodiments. For convenience of explanation, features that are different from those described using FIGS. 1 to 6 will be of primary focus.

For reference, the structure of the first gate stacked insulating film 130 may be as one of the embodiments illustrated in FIGS. 2 and 4 to 6, and the structure of the second gate stacked insulating film 230 may be as shown in the embodiment of FIG. 3.

Referring to FIG. 8, in the semiconductor device according to some embodiments, the width W1 of the first gate stack GS1 may be the same as the width W2 of the second gate stack GS2.

The width W1 of the first gate stack GS1 disposed in the first region I, which is the high-voltage operating region, may be the same as the width W2 of the second gate stack GS2 disposed in the second region II, which is the low-voltage operating region.

Figure 9:
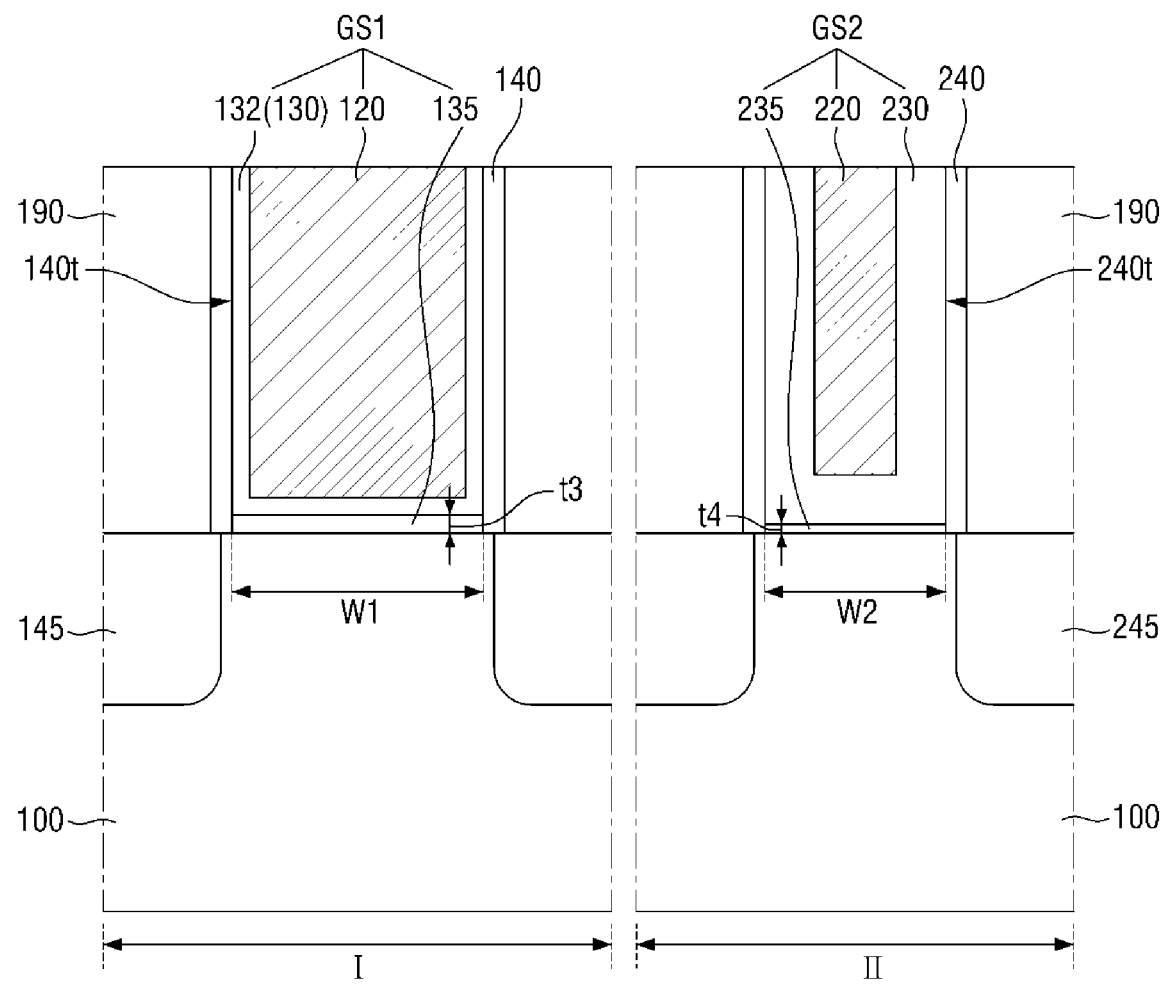

FIG. 9 is a cross-sectional view that illustrates a semiconductor device according to some example embodiments. For convenience of explanation, features that are different from those described using FIGS. 1 to 3 will be of primary focus.

Referring to FIG. 9, in a semiconductor device according to some embodiments, the first gate stack GS1 may not include the ferroelectric material film.

The first gate stacked insulating film 130 may not include the ferroelectric material film. The first gate stacked insulating film 130 may include only the first paraelectric material film 132.

As an example, the thickness of the first gate stacked insulating film 130 may be less than the thickness of the second gate stacked insulating film 230. As another example, the thickness of the first gate stacked insulating film 130 may be the same as the thickness of the second gate stacked insulating film 230. As still another example, the first gate stacked insulating film 130 may be thicker than the second gate stacked insulating film 230.

Figure 10:
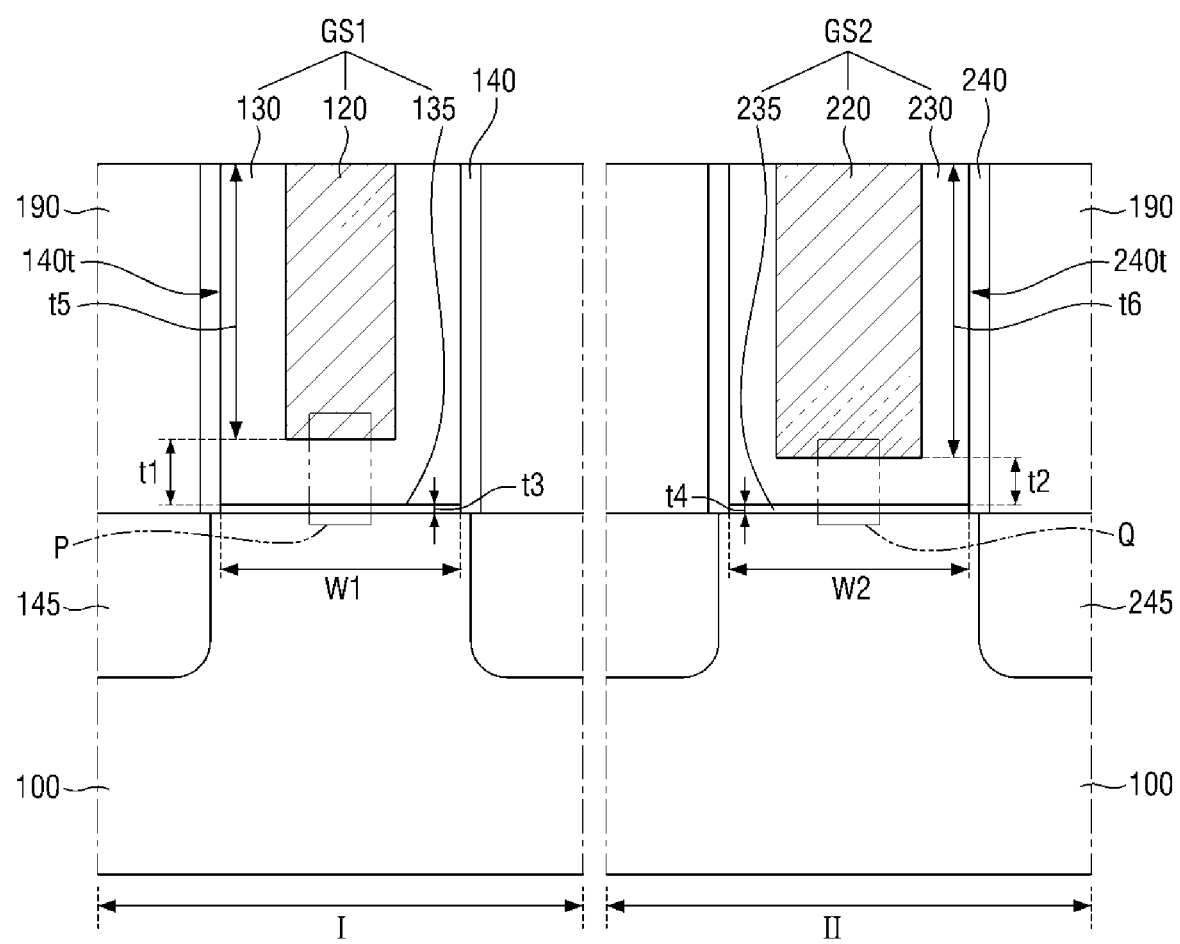

FIG. 10 is a cross-sectional view that illustrates a semiconductor device according to some example embodiments. For convenience of explanation, features that are different from those described using FIGS. 1, 3, and 6 will be of primary focus. For reference, an enlarged view of a region P of FIG. 10 may be similar to that of FIG. 6. An enlarged view of a region Q of FIG. 10 may be similar to that of FIG. 3.

Referring to FIGS. 3, 6 and 10, in a semiconductor device according to some embodiments, the first region I and the second region II may be low-voltage operating regions.

The first gate stack GS1 and the second gate stack GS2 may be disposed in the low-voltage operating region. Each of the first gate stack GS1 and the second gate stack GS2 may be disposed in a logic region or a memory region.

The width W1 of the first gate stack GS1 may be the same as the width W2 of the second gate stack GS2. The thickness t3 of the first interface film 135 may be the same as the thickness t4 of the second interface film 235.

The number of the first ferroelectric material films 131 included in the first gate stacked insulating film 130 may be greater than the number of the second ferroelectric material films 231 included in the second gate stacked insulating film 230.

As an example, the thickness t1 of the first gate stacked insulating film 130 may be greater than the thickness t2 of the second gate stacked insulating film 230. The average thickness of the first paraelectric material film 132 may be the same as the average thickness of the second paraelectric material film 232. The average thickness of the first ferroelectric material film 131 may be the same as the average thickness of the second ferroelectric material film 231.

As another example, unlike the example shown in FIG. 10, the thickness t1 of the first gate stacked insulating film 130 may be the same as the thickness t2 of the second gate stacked insulating film 230. The average thickness of the first paraelectric material film 132 may be less than the average thickness of the second paraelectric material film 232. The average thickness of the first ferroelectric material film 131 may be less than the average thickness of the second ferroelectric material film 231.

Figure 11:
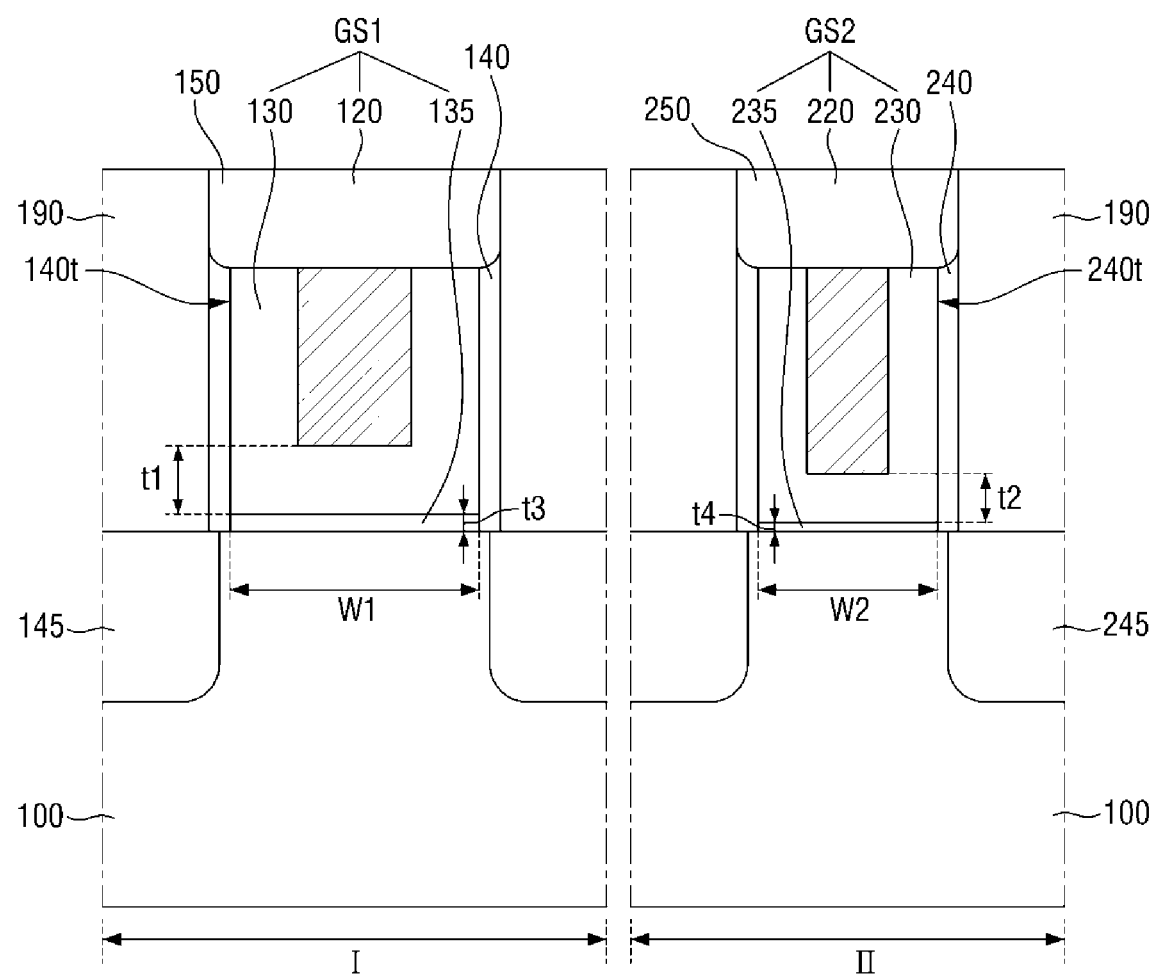

FIG. 11 is a diagram that illustrates a semiconductor device according to some example embodiments. For convenience of explanation, features that are different from those described using FIGS. 1 to 6 will be of primary focus.

Referring to FIG. 11, a semiconductor device according to some embodiments may further include a first gate capping pattern 150 and a second gate capping pattern 250.

The first gate capping pattern 150 may be disposed on the first gate stack GS1. The first gate capping pattern 150 may also be on and at least partially cover the upper surface of the first gate spacer 140. The upper surface of the first gate capping pattern 150 may be placed on the same plane as the upper surface of the interlayer insulating film 190 in a cross-sectional view of the semiconductor device as shown in FIG. 11.

The second gate capping pattern 250 may be disposed on the second gate stack GS2. The second gate capping pattern 250 may also be on and at least partially cover the upper surface of the second gate spacer 240. The upper surface of the second gate capping pattern 250 may be placed on the same plane as the upper surface of the interlayer insulating film 190 in a cross-sectional view of the semiconductor device as shown in FIG. 11.

Unlike the example embodiments of FIG. 11, as an example, the first gate capping pattern 150 may entirely cover the upper surface of the first gate stack GS1, but may not cover the upper surface of the first gate spacer 140. The second gate capping pattern 250 may entirely cover the upper surface of the second gate stack GS2, but may not cover the upper surface of the second gate spacer 240.

As another example, unlike the example embodiment shown in FIG. 11, at least a part of the first gate stacked insulating film 130 may be disposed between the first gate capping pattern 150 and the first gate spacer 140. At least a part of the second gate stacked insulating film 230 may be disposed between the second gate capping pattern 250 and the second gate spacer 240.

Each of the first gate capping pattern 150 and the second gate capping pattern 250 may include, for example, at least one of silicon nitride (SiN), silicon oxynitride (SiON), silicon oxide (SiO$_2$), silicon carbonitride (SiCN), silicon oxycarbonitride (SiOCN), and combinations thereof.

Figure 12:
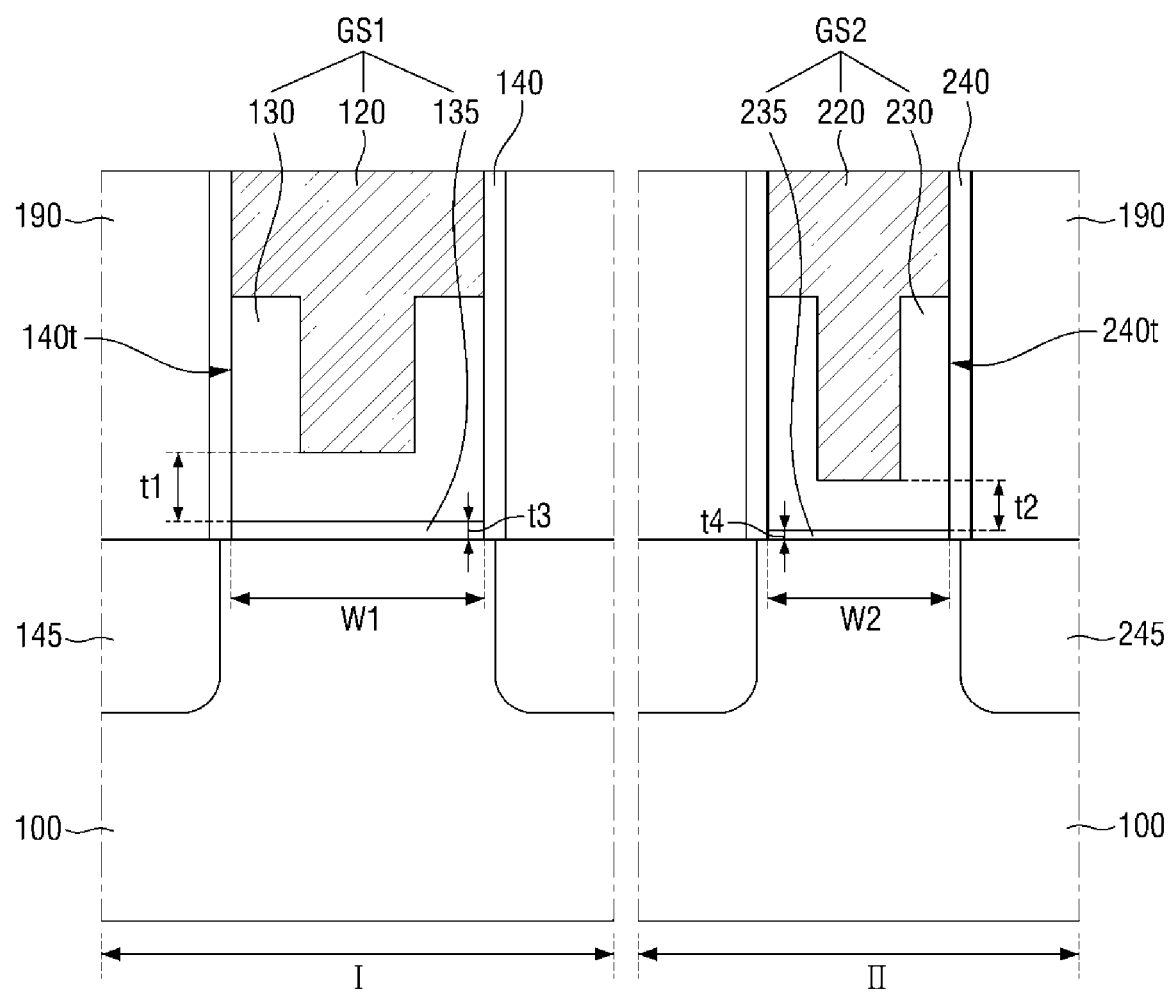

FIG. 12 is a cross-sectional view that illustrates a semiconductor device according to some example embodiments. For convenience of explanation, features that are different from those described using FIGS. 1 to 6 will be of primary focus.

Referring to FIG. 12, in a semiconductor device according to some embodiments, the first gate electrode 120 may be on and at least partially cover the uppermost surface of the first gate stacked insulating film 130 in a cross-sectional view of the semiconductor device. The second gate electrode 220 may be on and at least partially cover the uppermost surface of the second gate stacked insulating film 230.

A part of the first gate stacked insulating film 130 extending along the sidewall of the first gate trench 140t may be chamfered. A part of the second gate stacked insulating film 230 extending along the sidewall of the second gate trench 240t may be chamfered.

Unlike the example embodiment of FIG. 12, only one of the first gate stacked insulating film 130 and the second gate stacked insulating film 230 may be chamfered.

Figure 13:
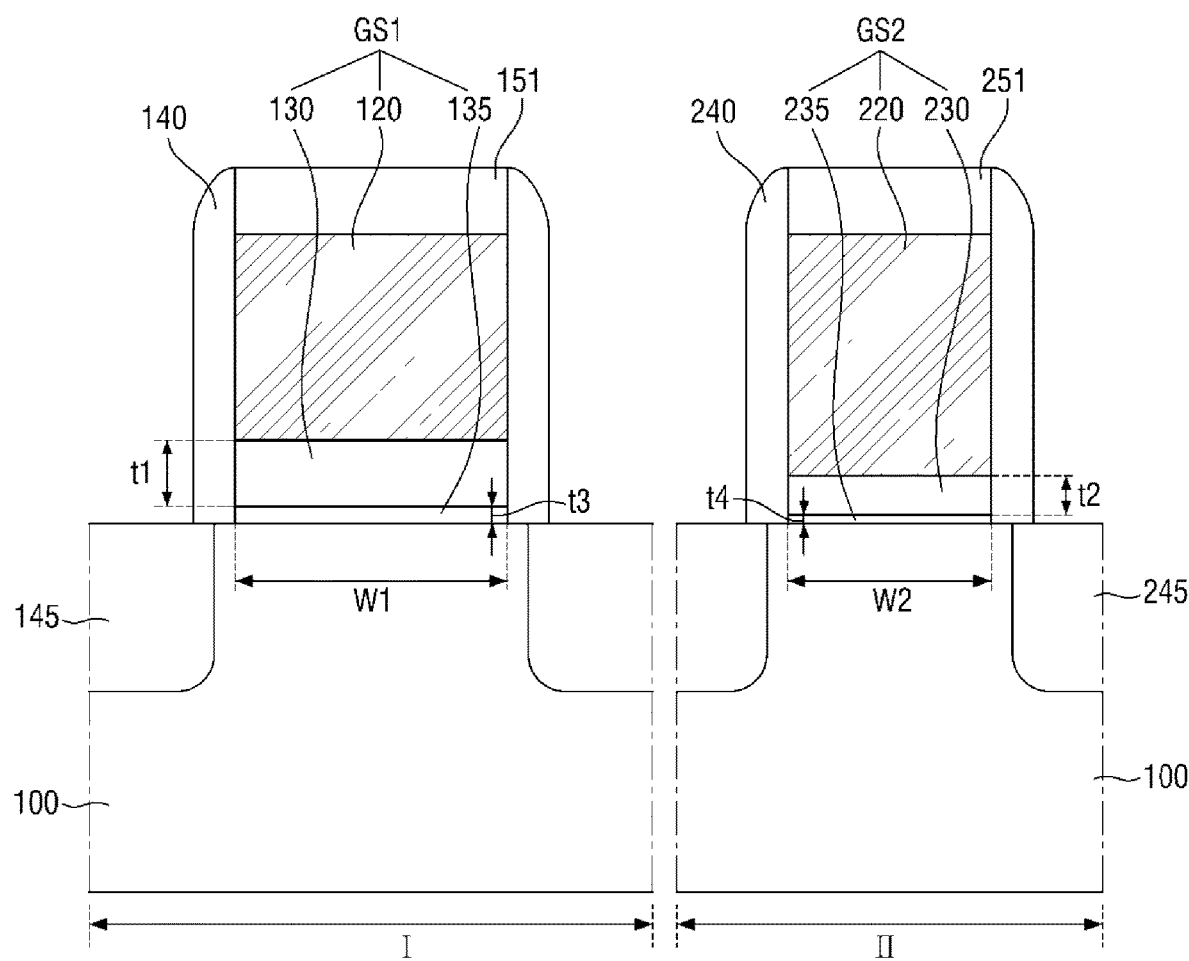

FIG. 13 is a cross-sectional view that illustrates a semiconductor device according to some example embodiments. For convenience of explanation, features that are different from those described using FIGS. 1 to 6 will be of primary focus.

Referring to FIG. 13, in a semiconductor device according to some embodiments, the first gate stacked insulating film 130 may not include a portion that extends between the first gate electrode 120 and the first gate spacer 140. The second gate stacked insulating film 230 may not include a portion that extends between the second gate electrode 220 and the second gate spacer 240.

A first gate hard mask 151 may be disposed on the first gate electrode 120. A second gate hard mask 152 may be disposed on the second gate electrode 220.

The first gate spacer 140 may be disposed on the sidewall of the first interface film 135, the sidewall of the first gate stacked insulating film 130, the sidewall of the first gate electrode 120, and the sidewall of the first gate hard mask 151. The second gate spacer 240 may be disposed on the sidewall of the second interface film 235, the sidewall of the second gate stacked insulating film 230, the sidewall of the second gate electrode 220, and the sidewall of the second gate hard mask 251.

Each of the first gate hard mask 151 and the second gate hard mask 251 may include, for example, at least one of silicon nitride (SiN), silicon oxynitride (SiON), silicon oxide (SiO$_2$), silicon carbonitride (SiCN), silicon oxycarbonitride (SiOCN), and combinations thereof.

Figure 14:
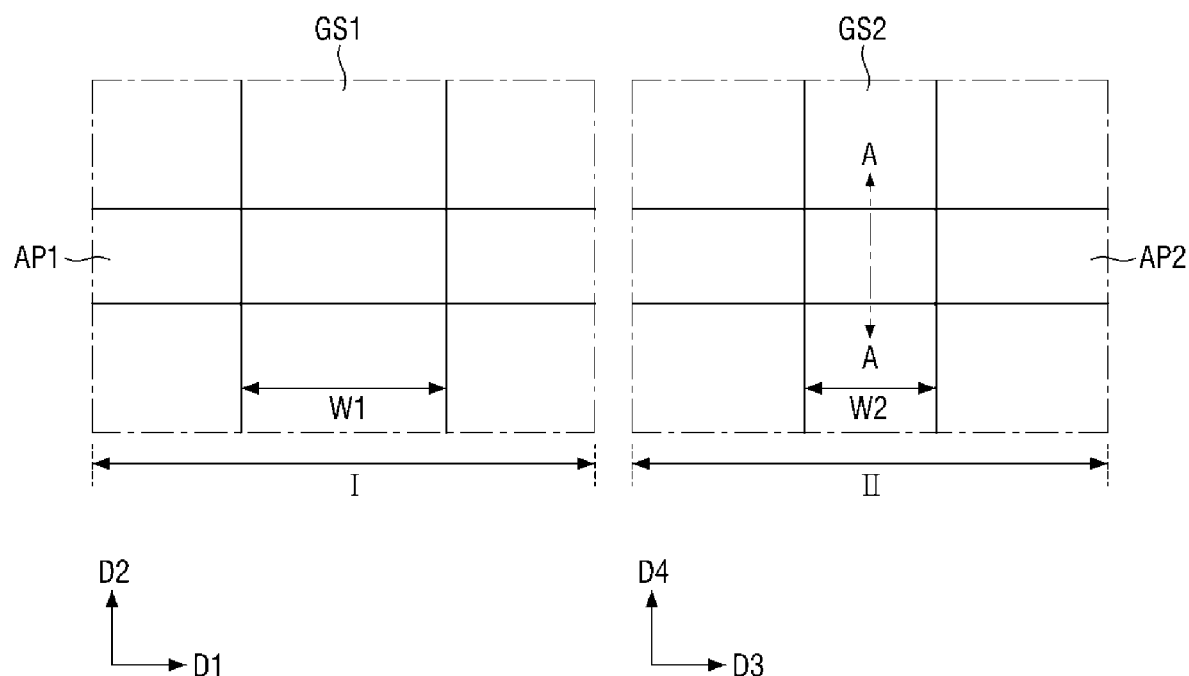
FIG. 14 is a layout diagram that illustrates a semiconductor device according to some example embodiments of the inventive concept.
Figure 15:
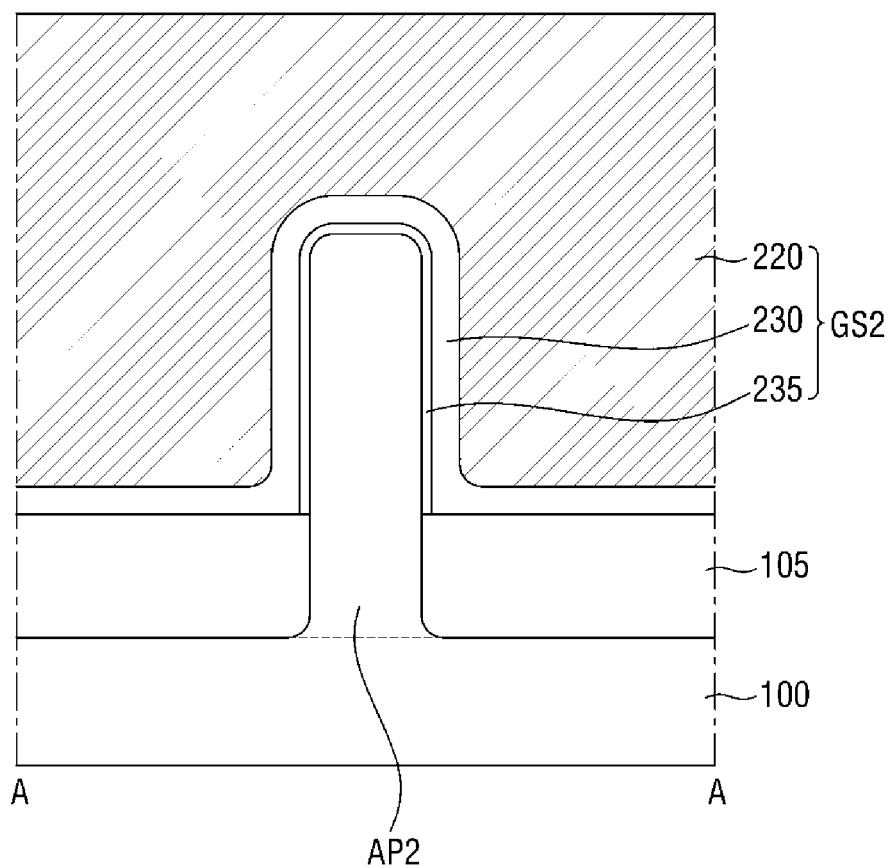
FIG. 15 is a cross-sectional view taken along a line A-A of FIG. 14.

FIG. 14 is a layout diagram that illustrates a semiconductor device according to some example embodiments. FIG. 15 is a cross-sectional view taken along a line A-A of FIG. 14. For convenience of explanation, features that are different from those described using FIGS. 1 to 6 will be of primary focus. For reference, FIG. 15 may illustrate a fin-type transistor (FinFET).

Referring to FIGS. 14 and 15, a semiconductor device according to some embodiments may include a first active pattern AP1, a second active pattern AP2, a first gate stack GS1 and a second gate stack GS2.

The first active pattern AP1 and the first gate stack GS1 may be disposed in the first region I. The second active pattern AP2 and the second gate stack GS2 may be disposed in the second region II.

The first active pattern AP1 may extend long in the first direction D1. The first gate stack GS1 may extend lengthwise in the second direction D2. The first gate stack GS1 may intersect the first active pattern AP1. Description of the first active pattern AP1 and the first gate stack GS1 may be substantially the same as the description of a second active pattern AP2 and a second gate stack GS2 as provided below.

The second active pattern AP2 may extend lengthwise in a third direction D3. The second active pattern AP2 may protrude from the substrate 100. The field insulating film 105 may be on and at least partially cover a part of the sidewall of the second active pattern AP2. The second active pattern AP2 may protrude upward from the upper surface of the field insulating film 105. The field insulating film 105 may include, for example, at least one of silicon nitride (SiN), silicon oxynitride (SiON), and/or silicon oxide (SiO$_2$).

The second gate stack GS2 may extend lengthwise in a fourth direction D4. The second gate stack GS2 may intersect the second active pattern AP2. The second gate stack GS2 may be disposed on the second active pattern AP2. The second gate stack GS2 may be on and at least partially cover the second active pattern AP2 protruding upward from the upper surface of the field insulating film 105.

Although FIG. 14 shows the second interface film 235 as not extending along the upper surface of the field insulating film 105, embodiments of the inventive concept are not limited thereto. The second interface film 235 may be formed along the upper surface of the field insulating film 105 based on the method of forming the second interface film 235. The second gate stacked insulating film 230 may extend along the profile of the second active pattern AP2 and the upper surface of the field insulating film 105. The second gate electrode 220 may be disposed on the second gate stacked insulating film 230.

The first active pattern AP1 and the second active pattern AP2 may include at least one of the materials of the channel film described with reference to FIGS. 1 to 3.

Figure 16:
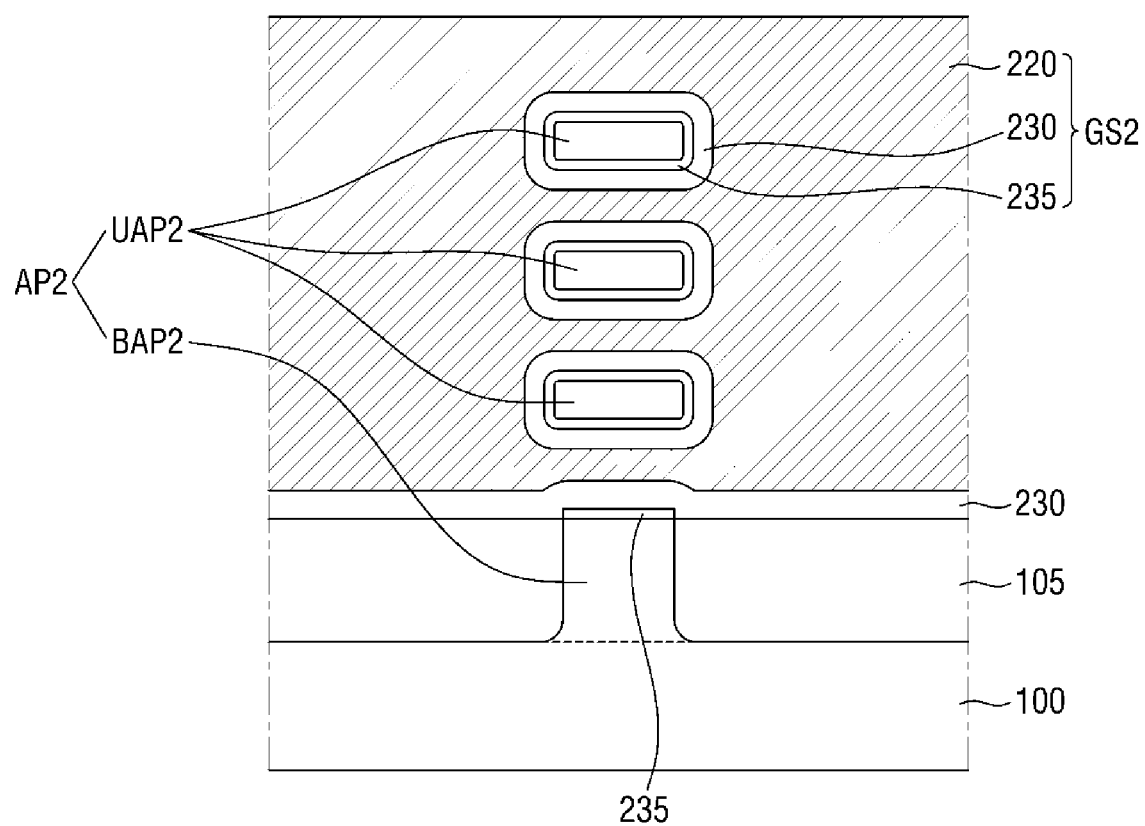
FIG. 16 is a cross-sectional view that illustrates a semiconductor device according to some example embodiments of the inventive concept.

FIG. 16 is a diagram that illustrates a semiconductor device according to some example embodiments. For convenience of explanation, features that are different from those described using FIGS. 14 and 15 will be of primary focus. For reference, FIG. 16 may illustrate a transistor including nanowires or nanosheets.

Referring to FIG. 16, in a semiconductor device according to some embodiments, the second active pattern AP2 may include a second lower active pattern BAP2 and a second upper active pattern UAP2.

The field insulating film 105 may be on and at least partially cover at least some of the sidewalls of the second lower active pattern BAP2. The second upper active pattern UAP2 may be spaced apart from the second lower active pattern BAP2 in a thickness direction of the substrate 100, i.e., a vertical direction in the cross-sectional view of FIG. 16. Respective second upper active patterns UAP2 may also be spaced apart from each other in the thickness direction of the substrate 100.

The second gate stack GS2 may wrap or border the second upper active pattern UAP2.

The first active pattern AP1 may also have substantially the same shape as that of the second active pattern AP2.

Figure 17:
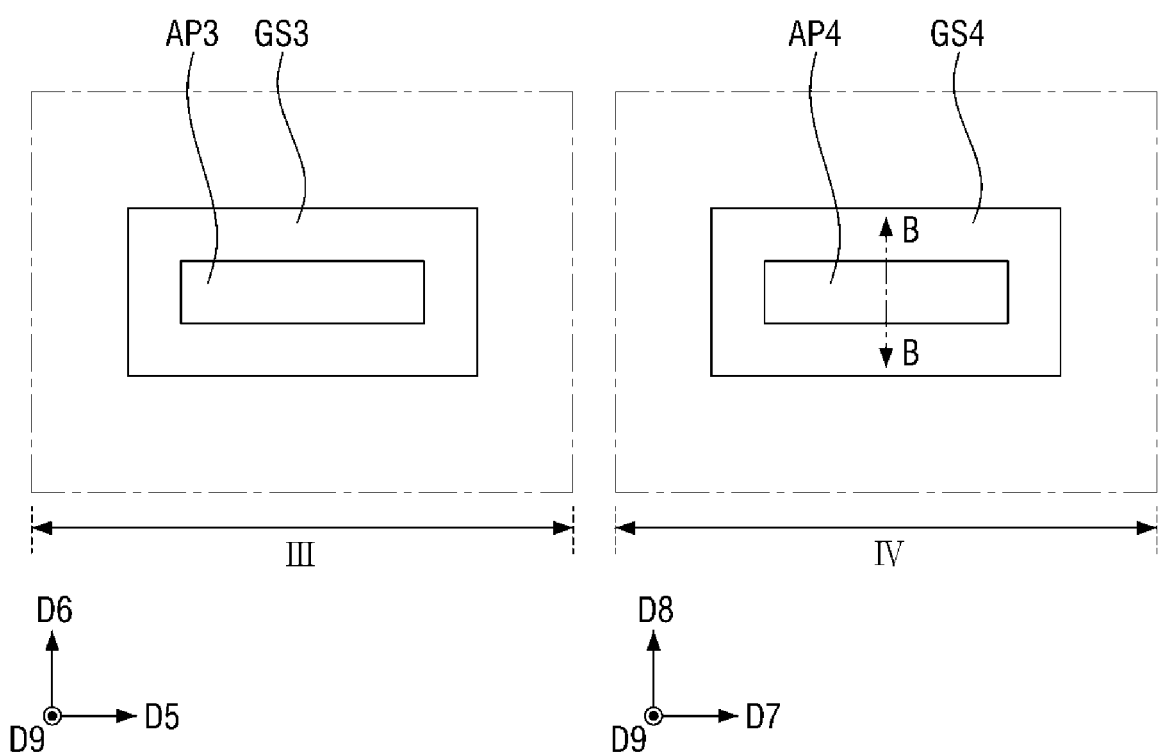
FIG. 17 is a layout diagram that illustrates a semiconductor device according to further example embodiments of the inventive concept.
Figure 18:
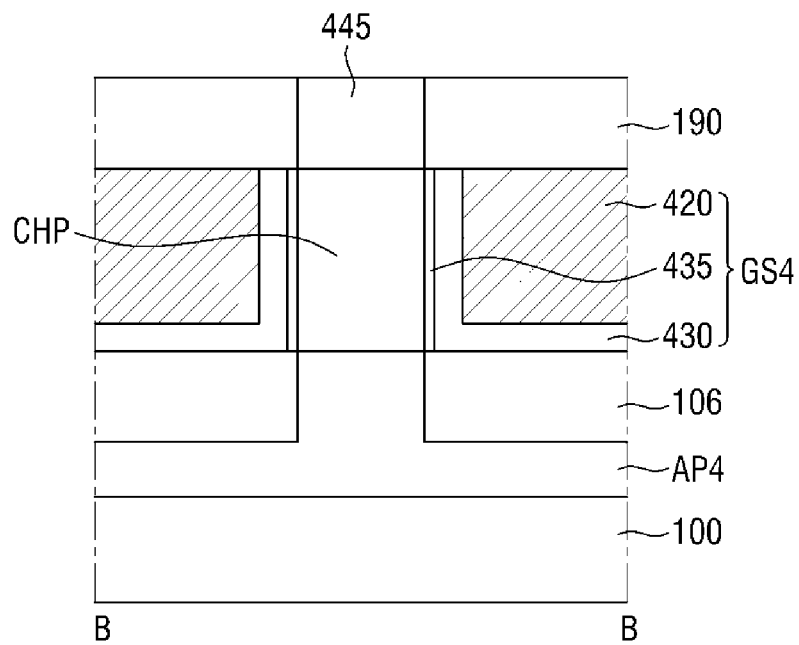
FIG. 18 is a cross-sectional view taken along a line B-B of FIG. 17.

FIG. 17 is a layout diagram that illustrates a semiconductor device according to some example embodiments. FIG. 18 is a cross-sectional view taken along a line B-B of FIG. 17.

For reference, FIG. 18 is a cross-sectional view taken along a fourth region IV of FIG. 17. When the third region III of FIG. 17 is cut, as in the case of cutting the fourth region IV of FIG. 17 along the line B-B, the cut surface of the third region III of FIG. 17 may be similar to that of FIG. 18.

For reference, FIGS. 17 and 18 may illustrate a vertical transistor (vertical FET).

Referring to FIGS. 17 and 18, a semiconductor device according to some embodiments may include a third active pattern AP3, a fourth active pattern AP4, a third gate stack GS3, and a fourth gate stack GS4.

The substrate 100 may include a third region III and a fourth region IV. As an example, the third region III may be a high-voltage operating region, and the fourth region IV may be a low-voltage operating region. As another example, each of the third region III and the fourth region IV may be low-voltage operating regions.

The third active pattern AP3 and the third gate stack GS3 may be disposed in the third region III. The third active pattern AP3 may extend in a fifth direction D5. The third active pattern AP3 may include a long side extending in the fifth direction D5, and a short side extending in a sixth direction D6. The third gate stack GS3 may be formed around the third active pattern AP3. Description of the third active pattern AP3 and the third gate stack GS3 may be substantially the same as the description of a fourth active pattern AP4 and a fourth gate stack GS4 to be provided below.

The fourth active pattern AP4 and the fourth gate stack GS4 may be disposed in the fourth region IV. The fourth active pattern AP4 may be disposed on the substrate 100. The fourth active pattern AP4 may extend in a seventh direction D7. The fourth active pattern AP4 may include a long side extending in the seventh direction D7, and a short side extending in an eighth direction D8. The fourth active pattern AP4 may be used as a source/drain region of a transistor.

A spacer pattern 106 may be on and at least partially cover a part of the fourth active pattern AP4. A part of the fourth active pattern AP4 may be exposed by the spacer pattern 106. Although the upper surface of the spacer pattern 106 and the upper surface of the fourth active pattern AP4 are shown to be placed on the same plane in the cross-sectional view of FIG. 18, embodiments of the present inventive concept are not limited thereto. The spacer pattern 106 may include, for example, at least one of silicon nitride (SiN), silicon oxynitride (SiON), and/or silicon oxide ($SiO_2$).

A channel pattern CHP extending in a ninth direction D9 may be disposed on the fourth active pattern AP4 at least partially exposed by the spacer pattern 106. The channel pattern CHP may be directly connected to the fourth active pattern AP4. The channel pattern CHP may be used as a channel region of the transistor.

The fourth gate stack GS4 may wrap or border the sidewalls of the channel pattern CHP extending in a ninth direction D9. The fourth gate stack GS4 may include a fourth interface film 435, a fourth gate stacked insulating film 430, and a fourth gate electrode 420.

Although it is shown in FIG. 18 that the fourth interface film 435 is formed on the sidewall of the channel pattern CHP and is not formed on the upper surface of the spacer pattern 106, embodiments of the present inventive concept are not limited thereto.

The fourth gate stacked insulating film 430 may extend along the sidewalls of the channel pattern CHP and the upper surface of the spacer pattern 106. In the cross-sectional view of FIG. 18, the fourth gate stacked insulating film 430 may have, for example, an L shape. The fourth gate stacked insulating film 430 may include a plurality of ferroelectric material films as described in FIG. 3.

The fourth gate electrode 420 may be disposed on the fourth gate stacked insulating film 430. The fourth gate stacked insulating film 430 may not be formed along the upper surface of the fourth gate electrode 420.

An upper semiconductor pattern 445 may be disposed on the channel pattern CHP. The upper semiconductor pattern 445 may be used as a source/drain region of the transistor. The interlayer insulating film 190 may wrap or border the sidewalls of the upper semiconductor pattern 445.

The fourth active pattern AP4, the channel pattern CHP and the upper semiconductor pattern 445 may each include a material having semiconductor properties.

Figure 19:
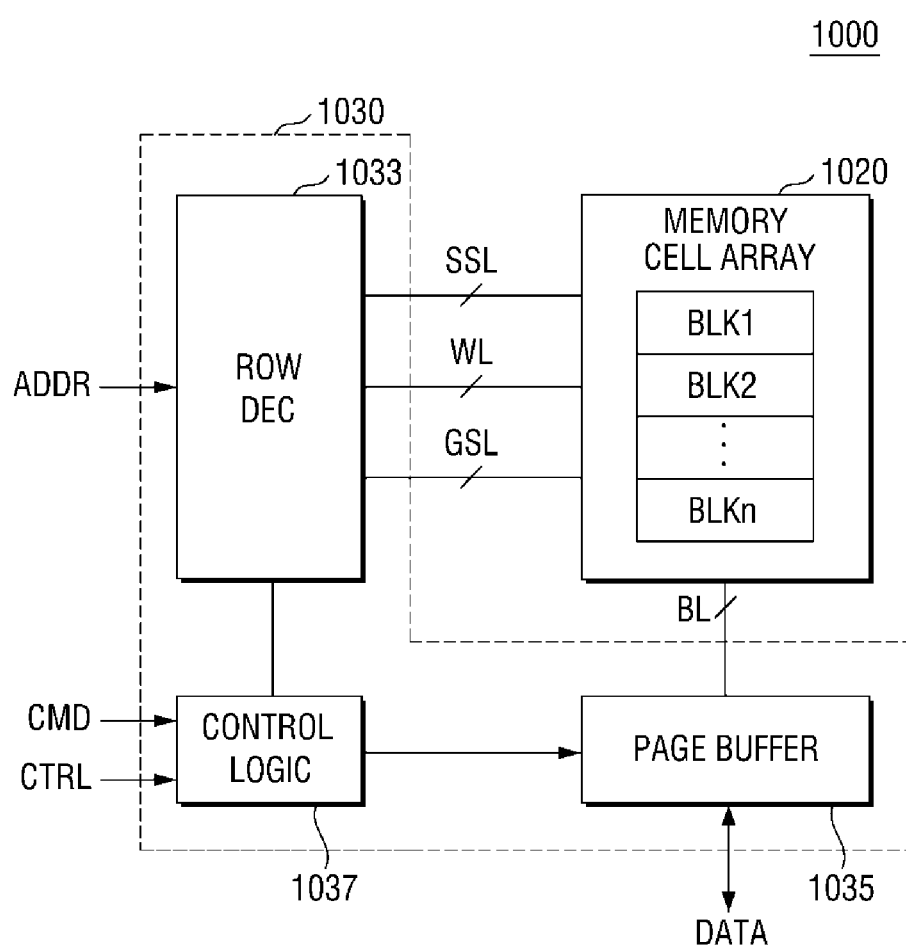
FIG. 19 is a block diagram illustrating a semiconductor device according to some example embodiments of the inventive concept.
Figure 20:
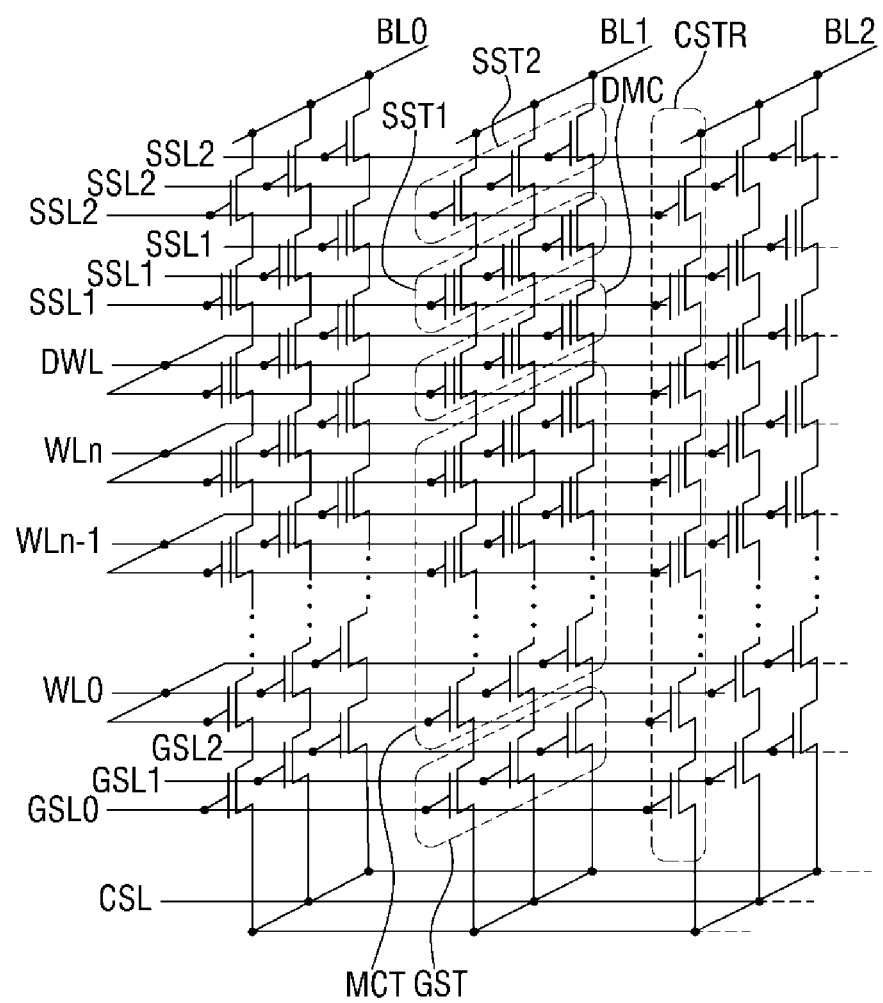
FIG. 20 is a circuit diagram illustrating one of the memory cell blocks of FIG. 19.

FIG. 19 is a block diagram illustrating a semiconductor device according to some embodiments. FIG. 20 is a circuit diagram showing one of the memory cell blocks of FIG. 19.

Referring to FIG. 19, a semiconductor device 1000 according to some embodiments may include a memory cell array 1020 and a peripheral circuit 1030.

The memory cell array 1020 may include a plurality of memory cell blocks BLK1 to BLKn. Each of the memory cell blocks BLK1 to BLKn may include a plurality of memory cells. The memory cell blocks BLK1 to BLKn may be connected to the peripheral circuit 30 through bit lines BL, word lines WL, at least one string selection line SSL, and at least one ground selection line GSL.

Specifically, the memory cell blocks BLK1 to BLKn may be connected to a row decoder 1033 through the word lines WL, at least one string selection line SSL, and at least one ground selection line GSL. Further, the memory cell blocks BLK1 to BLKn may be connected to a page buffer 1035 through the bit lines BL.

The peripheral circuit 1030 may receive an address ADDR, a command CMD, and a control signal CTRL from the outside of the semiconductor device 1000, and may transmit and receive data to and from a device outside the semiconductor device 1000, i.e., from an external source device, such as a controller or host. The peripheral circuit 1030 may include a control logic 1037, a row decoder 1033 and a page buffer 1035.

Although not shown, the peripheral circuit 1030 may further include various sub-circuits, such as an I/O circuit, a voltage generation circuit that generates various voltages necessary for the operation of the semiconductor device 1000, and an error correction circuit for correcting an error in data that are read from the memory cell array 1020.

The control logic 1037 may be connected to the row decoder 1033, the voltage generator, and the I/O circuit. The control logic 1037 may control the overall operations of the semiconductor device 1000. The control logic 1037 may generate various internal control signals used in the semiconductor device 1000, in response to the control signal CTRL.

For example, the control logic 1037 may control voltage levels to be provided to the word lines WL and the bit lines BL when performing a memory operation, such as a program operation or an erase operation.

The row decoder 1033 may select at least one of the plurality of memory cell blocks BLK1 to BLKn in response to the address ADDR, and may select at least one word line WL, at least one string selection line SSL, and at least one ground selection line GSL of the selected memory cell blocks BLK1 to BLKn. The row decoder 1033 may transfer a voltage for performing the memory operation to the word lines WL of the selected memory cell blocks BLK1 to BLKn.

The page buffer 1035 may be connected to the memory cell array 1020 through the bit line BL. The page buffer 1035 may operate as a writer driver or a sense amplifier. Specifically, at the time of the program operation, the page buffer 1035 may operate as a write driver and apply a voltage according to the data DATA to be stored in the memory cell array 1020 to the bit lines BL. At the time of the read operation, the page buffer 1035 may operate as a sense amplifier to detect the data DATA stored in the memory cell array 1020.

Referring to FIG. 20, a memory cell block according to some embodiments may include a common source line CSL, a plurality of bit lines BL, and a plurality of cell strings CSTR disposed between the common source line CSL and the bit lines BL.

A plurality of cell strings CSTR may be connected in parallel to each of the bit lines BL0 to BL2. The plurality of cell strings CSTR may be commonly connected to the common source line CSL. A plurality of common source line CSL may be arranged two-dimensionally. The same voltage may be electrically applied to the common source line CSL or each of the common source lines CSL may be electrically controlled independently.

For example, each of the cell strings CSTR may be made up of serially connected string selection transistors SST1 and SST2, serially connected memory cells MCT, and a ground selecting transistor GST. In addition, each of the memory cells MCT includes a data storage element.

As an example, each cell string CSTR may include serially connected first and second string selection transistors SST1 and SST2, the second string selection transistor SST2 may be connected to the bit lines BL0 to BL2, and the ground selection transistor GST may be connected to the common source line CSL. The memory cells MCT may be connected in series between the first string selection transistor SST1 and the ground selection transistor GST.

Furthermore, each of the cell strings CSTR may further include a dummy cell DMC connected between the first string selection transistor SST1 and the memory cell MCT. Although not shown in the drawing, the dummy cell DMC may also be connected between the ground selection transistor GST and the memory cell MCT. As another example, the ground selection transistor GST in each cell string CSTR may be made up of a plurality of serially connected MOS transistors, similar to the first and second string selection transistors SST1 and SST2. As still another example, each cell string CSTR may include a single string selection transistor.

According to some embodiments, the first string selection transistor SST1 may be controlled by the first string selection line SSL1, and the second string selection transistor SST2 may be controlled by the second string selection line SSL2. The memory cells MCT may be controlled by a plurality of word lines WL0 to WLn, and the dummy cells DMC may be controlled by the dummy word line DWL. Also, the ground selection transistor GST may be controlled by the ground selection line GSL. The common source line CSL may be commonly connected to the sources of the ground selection transistors GST.

One cell string CSTR may be made up of a plurality of memory cells MCT having different distances from the common source line CSL. Further, a plurality of word lines WL0 to WLn, and DWL may be disposed between the common source lines CSL and the bit lines BL0 to BL2.

The gate electrodes of the memory cells MCT, which are disposed at substantially the same distance from the common source line CSL, are commonly connected to one of the word lines WL0 to WLn, and DWL, and may be in an equipotential state. Even if the gate electrodes of the memory cells MCT are disposed at substantially the same level or distance from the common source lines CSL, however, the gate electrodes disposed in different rows or columns may be controlled independently.

The ground selection lines GSL0 to GSL2 and the string selection lines SSL1 and SSL2 may extend, for example, in the same direction as the word lines WL0 to WLn, and DWL. The ground selection lines GSL0 to GSL2 and the string selection lines SSL1 and SSL2 disposed at substantially the same level or distance from the common source lines CSL may be electrically separated from each other.

In a semiconductor device according to some example embodiments, the transistor including the gate stack described above with reference to FIGS. 1 to 18 may be disposed in the peripheral circuit 1030.

An NCFET including a ferroelectric material film may be disposed in the peripheral circuit 1030. As an example, the NCFET disposed in the peripheral circuit 1030 may be transistors having the same structure. As another example, the NCFET disposed in the peripheral circuit 1030 may be transistors having different structures. For example, the peripheral circuit 1030 may include both the transistor of the first region I described with reference to FIGS. 1 to 16 and the transistor of the second region II described with reference to FIGS. 1 to 16. As still another example, the NCFET disposed in the peripheral circuit 1030 may have the structure of the VFET described with reference to FIGS. 17 and 18.

Figure 21:
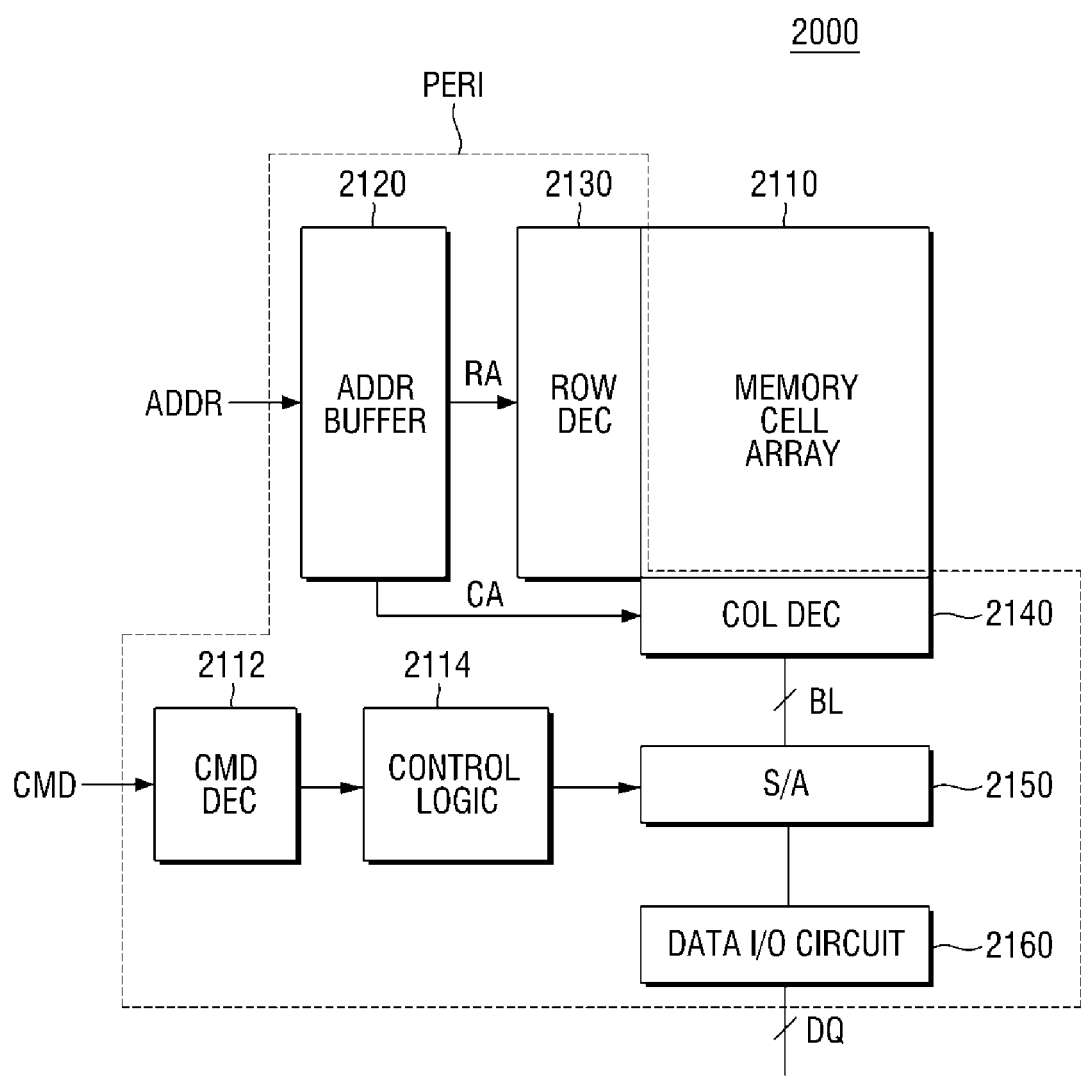
FIG. 21 is a block diagram illustrating a semiconductor device according to further example embodiments of the inventive concept.

FIG. 21 is a block diagram that illustrates a semiconductor device according to some example embodiments.

Referring to FIG. 21, a semiconductor device 2000 may be a storage device including semiconductor elements. The semiconductor device 2000 may output data through data lines DQ in response to the command CMD, the address ADDR, and the control signals received from an external device, for example, a memory controller.

The semiconductor device 2000 may include a memory cell array 2110, an address buffer 2120, a row decoder 2130, a command decoder 2112, a control logic 2114, a bit line sense amplifier unit 2150, and data I/O circuit 2160. The address buffer 2120, the row decoder 2130, the command decoder 2112, the control logic 2114, the bit line sense amplifier unit 2150, and the data I/O circuit 2160 may be peripheral circuits PERI.

The memory cell array 2110 includes a plurality of memory cells provided in the form of a matrix arranged in rows and columns. The memory cell array 2110 may include a plurality of word lines and a plurality of bit lines BL connected to the memory cells. A plurality of word lines may be connected to the rows of memory cells, and a plurality of bit lines BL may be connected to the columns of the memory cells.

The command decoder 2112 may be configured to decode a write enable signal (/WE), a row address strobe signal (/RAS), a column address strobe signal (/CAS), a chip selection signal (/CS) or the like received from the external device, for example, memory controller, such that the control signals corresponding to the command CMD may be generated by the control logic 2114. The command CMD may include an active command, a read command, a write command, a pre-charge command, and the like.

The address buffer 2120 may be configured to receive the address ADDR from a memory controller, which is an external device. The address ADDR includes a row address RA that addresses the row of the memory cell array 2110, and a column address CA that addresses the column of the memory cell array 2110. The address buffer 2120 may be configured to send the row address RA to the row decoder 2130, and may be configured to send the column address CA to the column decoder 140.

The row decoder 2130 may be configured to select any one of a plurality of word lines connected to the memory cell array 2110. The row decoder 2130 may be configured to decode the row address RA received from the address buffer 2120, to select one of the word lines corresponding to the row address RA, and to activate the selected word line.

The column decoder 2140 may be configured to select a predetermined bit line among a plurality of bit lines BL of the memory cell array 2110. The column decoder 2140 may be configured to decode the column address CA received from the address buffer 2120 and to select a predetermined bit line BL corresponding to the column address CA. The bit line sense amplifier unit 2150 may include a plurality of bit line sense amplifiers connected to each of the bit lines BL of the memory cell array 2110. The bit line sense amplifiers may be configured to sense a voltage change of the connected bit line, to amplify the voltage change, and to output the amplified voltage. The data I/O circuit 2160 may be configured to output data, which is generated on the basis of the voltage sensed and amplified from the bit line sense amplifier unit 2150, to the outside through the data lines DQ.

The bit line sense amplifier is connected to one bit line BL and one complementary bit line, and sensing and amplification operations may be controlled through the first control line and the second control line. For example, the first control line is a line that is connected to an internal power supply of the semiconductor device 2000 to selectively supply the internal power supply voltage to a predetermined node of the bit line sense amplifier. The second control line may be a line that is connected to the ground terminal of the semiconductor device 2000 to ground a predetermined node of the bit line sense amplifier. Specifically, the first control line may be connected to the first node of the bit line sense amplifier, and the second control line may be connected to the second node of the bit line sense amplifier.

The memory cell array 2110 may be a dynamic random access memory, such as a DRAM (Dynamic Random Access Memory), a SDRAM (Synchronous DRAM), a DDR SDRAM (Double Data Rate SDRAM), a LPDDR SDRAM (Low Power Double Data Rate SDRAM), a GDDR SDRAM (Graphics Double Data Rate SDRAM), a DDR2 SDRAM, a DDR3 SDRAM, and a DDR4 SDRAM or a resistive memory such as a PRAM (Phase change Random Access Memory), a MRAM (Magnetic Random Access Memory), and/or an RRAM (Resistive Random Access Memory).

In a semiconductor device according to some embodiments, the transistor including the gate stack described with reference to FIGS. 1 to 18 may be disposed in the peripheral circuit PERI.

An NCFET including a ferroelectric material film may be disposed in the peripheral circuit PERI. As an example, the NCFET disposed in the peripheral circuit PERI may include transistors having the same structure. As another example, the NCFET disposed in the peripheral circuit PERI may include transistors having different structures from each other. For example, the peripheral circuit PERI may include both the transistor of the first region I described with reference to FIGS. 1 to 16, and the transistor of the second region II described with reference to FIGS. 1 to 16. As still another example, the NCFET disposed in the peripheral circuit PERI may have the structure of the VFET described with reference to FIGS. 17 and 18.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor device comprising:
a substrate including a first region and a second region;
a first gate stack on the first region and including a first gate stacked insulating film and a first gate electrode on the first gate stacked insulating film; and
a second gate stack on the second region and including a second gate stacked insulating film and a second gate electrode on the second gate stacked insulating film,
wherein a width of the first gate stack is greater than a width of the second gate stack,
wherein the first gate stacked insulating film includes a paraelectric material film; and
wherein the second gate stacked insulating film includes a plurality of ferroelectric material films.

2. The semiconductor device of claim 1, wherein a thickness of the first gate stacked insulating film is greater than a thickness of the second gate stacked insulating film.

3. The semiconductor device of claim 2, wherein the ferroelectric material films are second ferroelectric material films,
wherein the first gate stacked insulating film includes one or more first ferroelectric material films, and
wherein a number of the second ferroelectric material films is greater than a number of the first ferroelectric material films.

4. The semiconductor device of claim 2, wherein the ferroelectric material films are second ferroelectric material films,
wherein the first gate stacked insulating film includes a plurality of first ferroelectric material films, and
wherein a number of the second ferroelectric material films is identical to a number of the first ferroelectric material films.

5. The semiconductor device of claim 2, wherein the first gate stacked insulating film includes a plurality of first paraelectric material films, the plurality of first paraelectric material films including the paraelectric material film,
  wherein the second gate stacked insulating film includes a plurality of second paraelectric material films, and
  wherein an average thickness of the first paraelectric material films is greater than an average thickness of the second paraelectric material films.

6. The semiconductor device of claim 5, wherein the ferroelectric material films are second ferroelectric material films,
  wherein the first gate stacked insulating film includes a plurality of first ferroelectric material films,
  wherein an average thickness of the first ferroelectric material films is identical to an average thickness of the second ferroelectric material films, and
  wherein a number of the first ferroelectric material films is greater than a number of the second ferroelectric material films.

7. The semiconductor device of claim 1, wherein a thickness of the first gate stacked insulating film is identical to a thickness of the second gate stacked insulating film.

8. The semiconductor device of claim 7, wherein the ferroelectric material films are second ferroelectric material films,
  wherein the first gate stacked insulating film includes one or more first ferroelectric material films, and
  wherein a number of the second ferroelectric material films is greater than a number of the first ferroelectric material films.

9. The semiconductor device of claim 7, wherein the first gate stacked insulating film includes a plurality of first paraelectric material films,
  wherein the second gate stacked insulating film includes a plurality of second paraelectric material films, and
  wherein a thickness of the first paraelectric material films is greater than a thickness of the second paraelectric material films.

10. The semiconductor device of claim 1, wherein the first gate stacked insulating film includes no ferroelectric material.

11. The semiconductor device of claim 1, wherein the first gate stack includes a first interface film of a first thickness,
  wherein the second gate stack includes a second interface film of a second thickness smaller than the first thickness, and
  wherein the first gate stacked insulating film is on the first interface film, and the second gate stacked insulating film is on the second interface film.

12. The semiconductor device of claim 1, wherein each of the ferroelectric material films includes crystal grains having an orthorhombic crystal system.

13. A semiconductor device comprising:
  a substrate including a first region and a second region;
  a first gate stack on the first region and including a first gate stacked insulating film and a first gate electrode on the first gate stacked insulating film; and
  a second gate stack on the second region and including a second gate stacked insulating film and a second gate electrode on the second gate stacked insulating film,
  wherein the first gate stacked insulating film includes one or more first ferroelectric material films and a paraelectric material film,
  wherein the second gate stacked insulating film includes a plurality of second ferroelectric material films, and
  wherein a number of the second ferroelectric material films is greater than or equal to a number of the first ferroelectric material films.

14. The semiconductor device of claim 13, wherein the first region is a high-voltage operating region and the second region is a low-voltage operating region.

15. The semiconductor device of claim 14, wherein a thickness of the first gate stacked insulating film is greater than or equal to a thickness of the second gate stacked insulating film.

16. The semiconductor device of claim 13, wherein the first region and the second region are low-voltage operating regions.

17. The semiconductor device of claim 16, wherein a thickness of the first gate stacked insulating film is smaller than a thickness of the second gate stacked insulating film.

18. A semiconductor device comprising:
  a substrate including a first region and a second region;
  a first gate stack on the first region and including a first interface film of a first thickness, a first gate stacked insulating film on the first interface film, and a first gate electrode on the first gate stacked insulating film; and
  a second gate stack on the second region and including a second interface film of a second thickness smaller than the first thickness, a second gate stacked insulating film on the second interface film, and a second gate electrode on the second gate stacked insulating film,
  wherein a width of the first gate stack is greater than a width of the second gate stack,
  wherein the first gate stacked insulating film includes one or more first ferroelectric material films and a plurality of first paraelectric material films,
  wherein the second gate stacked insulating film includes a plurality of second ferroelectric material films and a plurality of second paraelectric material films, and
  wherein a number of the second ferroelectric material films is greater than or equal to a number of the first ferroelectric material films.

19. The semiconductor device of claim 18, wherein a thickness of each of the first paraelectric material films is greater than a thickness of each of the second paraelectric material films.

20. The semiconductor device of claim 18, wherein a thickness of the first gate stacked insulating film is greater than a thickness of the second gate stacked insulating film.

* * * * *